United States Patent
Nishimura

(10) Patent No.: US 10,410,944 B2
(45) Date of Patent: Sep. 10, 2019

(54) SEMICONDUCTOR DEVICE

(71) Applicant: ROHM CO., LTD., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/970,525

(22) Filed: May 3, 2018

(65) Prior Publication Data

US 2018/0331008 A1  Nov. 15, 2018

(30) Foreign Application Priority Data

May 10, 2017 (JP) ................. 2017-094071

(51) Int. Cl.
  *H01L 23/34*   (2006.01)
  *H01L 23/10*   (2006.01)
  *H01L 23/28*   (2006.01)
  *H01L 23/485*  (2006.01)
  *H01L 23/49*   (2006.01)
  (Continued)

(52) U.S. Cl.
  CPC .............. *H01L 23/34* (2013.01); *H01L 23/10* (2013.01); *H01L 23/28* (2013.01); *H01L 23/3121* (2013.01); *H01L 23/4855* (2013.01); *H01L 23/49* (2013.01); *H01L 33/58* (2013.01);
  (Continued)

(58) Field of Classification Search
  CPC ......... H01L 23/34; H01L 23/10; H01L 23/49; H01L 23/4855; H01L 23/28; H01L 33/54; H01L 33/42; H01L 2924/15153
  See application file for complete search history.

(56) References Cited

U.S. PATENT DOCUMENTS 6,480,389 B1 * 11/2002 Shie ................. H01L 33/58
                                                       257/E33.073
2007/0257335 A1 * 11/2007 O'Brien ............... H05K 1/053
                                                       257/618
(Continued)

FOREIGN PATENT DOCUMENTS

JP        2005277380 A    10/2005

*Primary Examiner* — Ahmed N Sefer
(74) *Attorney, Agent, or Firm* — Hamre, Schumann, Mueller & Larson, P.C.

(57) ABSTRACT

The present disclosure provides a semiconductor device for high efficiently releasing heat generated from a semiconductor element to the outside. The semiconductor device of the present disclosure includes a substrate, made of an intrinsic semiconductor material, having a substrate main surface facing toward a thickness direction z, and configured to have a recess recessed from the substrate main surface; an internal wiring layer, disposed on the substrate main surface and the recess; a columnar conductor, protruding from the internal wiring layer disposed on the substrate main surface toward a direction in which the substrate main surface faces; a semiconductor element, having an element main surface facing the same direction as the substrate main surface, and electrically connected to the internal wiring layer; and a sealing resin, filled into the recess and covering a portion of each of the columnar conductor and the semiconductor element; wherein the semiconductor element has a portion overlapping the recess when viewed in the thickness direction of the substrate, and the semiconductor device is configured to have a heat dissipating layer being in contact with the element main surface and exposed to the outside.

6 Claims, 24 Drawing Sheets

(51) Int. Cl.
*H01L 23/31* (2006.01)
*H01L 33/64* (2010.01)
*H01L 33/58* (2010.01)
*H01L 33/62* (2010.01)

(52) U.S. Cl.
CPC .............. *H01L 33/62* (2013.01); *H01L 33/64* (2013.01); *H01L 2224/16* (2013.01)

(56) References Cited

U.S. PATENT DOCUMENTS

| | | | |
|---|---|---|---|
| 2012/0146177 A1* | 6/2012 | Choi | H01L 25/16 257/528 |
| 2016/0027756 A1* | 1/2016 | Takeda | H01L 23/13 257/737 |
| 2017/0038438 A1* | 2/2017 | Yamagami | G01R 33/07 |
| 2017/0047308 A1* | 2/2017 | Ho | H01L 23/5386 |

* cited by examiner

SEMICONDUCTOR DEVICE

TECHNICAL FIELD

The present disclosure is related to a semiconductor device including a semiconductor element mounted on a substrate made of a single crystal intrinsic semiconductor material and finely processed.

BACKGROUND

In recent years, a so-called micro electro mechanical system (MEMS) in which various semiconductor elements are mounted on a micro-processed Si substrate (silicon wafer) by applying large scale integration (LSI) manufacturing technology, is becoming popular. While fabricating such MEMS, an anisotropic etching using an alkaline solution is applied as a micro-processing method for a Si substrate. Due to the anisotropic etching, a fine recess can be precisely formed on the Si substrate for mounting a semiconductor element.

For example, in patent literature 1, a semiconductor device (LED (light-emitting diode) package) based on the above MEMS manufacturing technology is disclosed. In the semiconductor device, a horn having a bottom surface and a lateral surface is formed on a Si substrate, and an LED chip is mounted on the bottom surface of the horn. The LED chip is configured to be accommodated in the horn. Further, on the bottom surface and the lateral surface of the horn, an electrode is formed to be electrically connected to the LED chip. A film of Ti layer and a Cu layer formed on the Si substrate including the horn by a sputtering method or the like is patterned by photolithography and etching to form the electrode. After the electrode is formed, the LED chip is mounted on the bottom surface of the horn, and a sealing resin (resin mold) is filled in the horn, such that the semiconductor device is formed.

For example, in the semiconductor device disclosed in the patent literature 1, even in the case that a semiconductor element other than the LED chip is mounted, it can also be configured that the semiconductor element is accommodated in the horn and covered by the sealing resin. In the case that the semiconductor element generates more heat while being electrically connected, there is the following problem: the thermal conductivity of the sealing resin is lower than that of the Si substrate, and thus it is difficult to efficiently dissipate the heat generated from the semiconductor element to the outside.

BACKGROUND TECHNICAL LITERATURES

Patent literatures

[Patent Literature 1] Japanese Patent Application Laid-Open Publication No. 2005-277380.

BRIEF SUMMARY OF THE INVENTION

Problems to be Solved

In view of the above circumstances, it is an object of the present disclosure to provide a semiconductor device for efficiently releasing heat generated from a semiconductor element to the outside.

Technical Solution for Solving Problems

The semiconductor device of the present disclosure includes: a substrate, made of an intrinsic semiconductor material, having a substrate main surface facing toward a thickness direction, and configured to have a recess recessed from the substrate main surface; an internal wiring layer, disposed on the substrate main surface and the recess; a columnar conductor, protruding from the internal wiring layer disposed on the substrate main surface toward a direction in which the substrate main surface faces; a semiconductor element, having an element main surface facing the same direction as the substrate main surface, and electrically connected to the internal wiring layer; and a sealing resin, filled into the recess and covering a portion of each of the columnar conductor and the semiconductor element; wherein the semiconductor element has a portion overlapping the recess when viewed in the thickness direction of the substrate, and the semiconductor device is configured to have a heat dissipating layer being in contact with the element main surface and exposed to the outside.

Preferably, in an embodiment of the present disclosure, the internal wiring layer includes a first wiring layer disposed on the substrate main surface, and a second wiring layer disposed on the recess, and the semiconductor element is mounted on the first wiring layer in a state of crossing the recess when viewed in the thickness direction.

Preferably, in an embodiment of the present disclosure, a passive element is mounted on the second wiring layer and accommodated in the recess.

Preferably, in an embodiment of the present disclosure, the internal wiring layer includes a first wiring layer disposed on the substrate main surface, and a second wiring layer disposed on the recess, the semiconductor element is mounted on the second wiring layer, and the element main surface is disposed away from the recess with respect to the substrate main surface in the thickness direction.

Preferably, in an embodiment of the present disclosure, a bonding layer is disposed on the first wiring layer, protrudes from the first wiring layer toward a direction in which the substrate main surface faces, and is disposed away from the columnar conductor, and the semiconductor element is bonded to the bonding layer.

Preferably, in an embodiment of the present disclosure, a bonding layer is disposed on the second wiring layer, and protrudes from the second wiring layer toward an inner side of the recess, and the semiconductor element is bonded to the bonding layer.

Preferably, in an embodiment of the present disclosure, a protecting film is configured to cover the first wiring layer and the second wiring layer, and a portion of each of the columnar conductor and the bonding layer protrudes from the protecting film.

Preferably, in an embodiment of the present disclosure, the recess has a bottom surface and a middle surface, the bottom surface is parallel with respect to the substrate main surface, and the middle surface is connected to the bottom surface and the substrate main surface and is inclined with respect to the bottom surface, and the semiconductor device further comprises an internal insulating film configured to cover the substrate main surface, the bottom surface and the middle surface, and the internal wiring layer is in contact with a surface of the internal insulating film.

Preferably, in an embodiment of the present disclosure, the internal insulating film comprises AlN.

Preferably, in an embodiment of the present disclosure, the bottom surface is rectangular, and the middle surface surrounds an end edge of the bottom surface.

Preferably, in an embodiment of the present disclosure, the intrinsic semiconductor material is Si.

Preferably, in an embodiment of the present disclosure, the columnar conductor has a top surface facing the same direction as the substrate main surface, the sealing resin has a resin main surface facing the same direction as the substrate main surface, and the top surface and the resin main surface are the same as the element main surface.

Preferably, in an embodiment of the present disclosure, an external insulating film is configured to cover a portion of the element main surface and the resin main surface and be exposed to the outside, and the heat dissipating layer is exposed from the external insulating film.

Preferably, in an embodiment of the present disclosure, a terminal is electrically connected to the columnar conductor and connected to the outside, and the terminal is exposed from the external insulating film.

Preferably, in an embodiment of the present disclosure, the external insulating film has a first insulating film being in contact with a portion of the element main surface and the resin main surface, and a second insulating film being in contact with the first insulting film and exposed to the outside, and the semiconductor device further comprises an external wiring layer disposed inside the first insulating film and the second insulating film and connecting the columnar conductor to the terminal.

Preferably, in an embodiment of the present disclosure, a first opening portion penetrating the first insulating film along the thickness direction to the top surface of the columnar conductor is formed on the first insulating film, a second opening portion penetrating the second insulating lm along the thickness direction is formed on the second insulating film, and the external wiring layer has a first embedded portion being embedded in the first opening portion and in contact with the top surface, and a second embedded portion being embedded in the second opening portion and in contact with the terminal.

Preferably, in an embodiment of the present disclosure, the external wiring layer further comprises an intermediate portion, and the intermediate portion is between the first insulating film and the second insulating film, and connected to both the first embedded portion and the second embedded portion.

Effects of the Present Disclosure

According to the semiconductor device of the present disclosure, the heat generated from the semiconductor element can be efficiently released to the outside.

Other features and advantages of the present disclosure will be clearer from the following detailed description taken in conjunction with the accompanying drawings.

DETAILED DESCRIPTION

Figure 1:
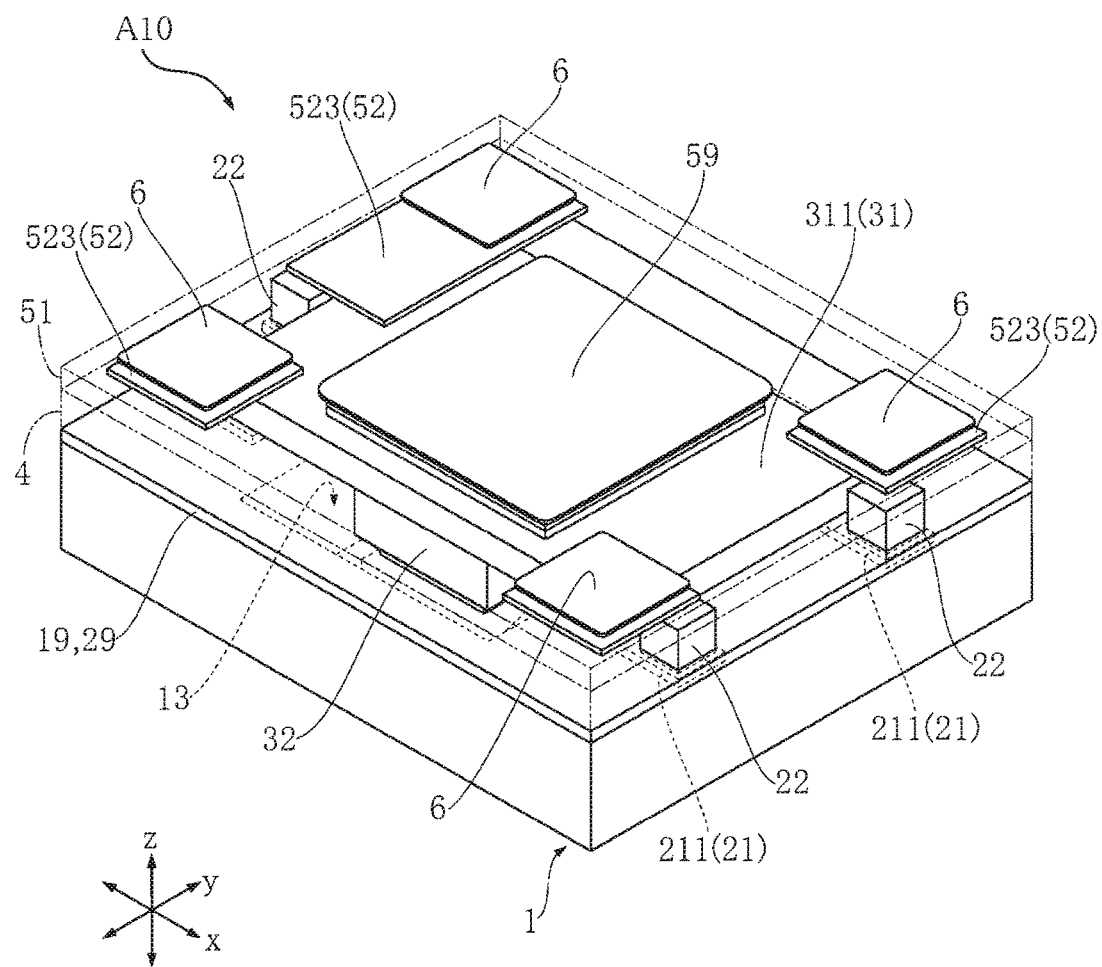
FIG. 1 is a perspective view showing a semiconductor device (showing a sealing resin and an external insulating film) according to the first embodiment of the present disclosure.

The implementation of the present invention (hereinafter referred to as "embodiments") will be described with reference to the accompanying drawings.

[First Embodiment]

Based on FIG. 1-FIG. 9, a semiconductor device A10 of the first embodiment of the present disclosure is illustrated. The semiconductor device 10 includes a substrate 1, an internal wiring layer 21, a columnar conductor semiconductor element 31 and a sealing resin 4, wherein a heat dissipating layer 59 is disposed on the semiconductor element 31. In the present embodiment, the semiconductor device A10 further includes an internal insulating film 19, a protecting film 29, a passive element 32, an external insulating film 51, an external wiring layer 52 and a terminal 6. Further, a first bonding layer 27 and a second bonding layer 28 are disposed on the internal wiring layer 21. Herein, in claims of the present disclosure, "a boding layer" is referred to the first bonding layer 27.

For ease of understanding, the sealing resin 4 and the external insulating film 51 are shown in FIG. 1. Further, both the sealing resin 4 and the external insulating film 51 are represented by imaginary lines (two-point chain lines) in FIG. 1. For ease of understanding, the external insulating film 51, the external wiring layer 52, the heat dissipating layer 59 and the terminal 6 are omitted in FIG. 3. For ease of understanding, the semiconductor element 31 is perspectively shown in FIG. 4 with respect to FIG. 3, and the sealing resin 4 is omitted. The semiconductor element 31 perspectively shown in FIG. 4 is represented by imaginary lines.

Figure 2:
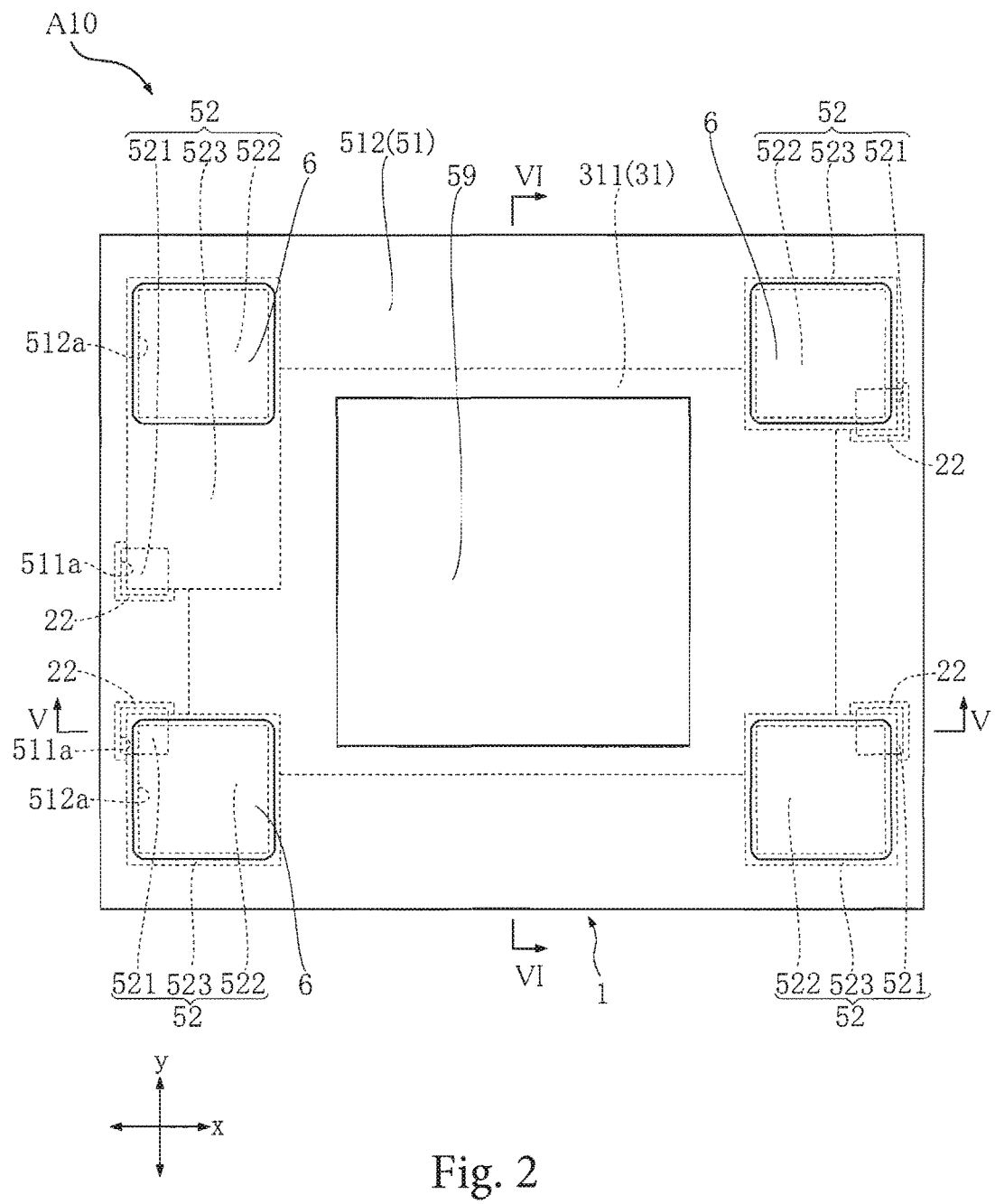
FIG. 2 is a top view of the semiconductor device shown in FIG. 1.

The semiconductor device A10 is surface mounted on circuit boards of various electronic devices. As shown in FIG. 1 and FIG. 2, as viewed along the thickness direction z of the substrate 1 (hereinafter referred to as "top view"), the semiconductor device A10 is a rectangular shape. Herein, for the ease of understanding, the longitudinal direction of the semiconductor device A10 perpendicular to the thickness direction z (hereinafter referred to as "thickness direction z") of the substrate 1 is referred to as a first direction x. Further, the short-side direction of the semiconductor device A10 perpendicular to both the thickness direction z of the substrate 1 and the first direction x is referred to as a second direction y.

As shown in FIG. 1-FIG. 6, the substrate 1 is member for arranging the internal wiring layer 21 and the columnar conductor 22, and mounting the semiconductor device A10 on the circuit board. In the present embodiment, the semiconductor element 31 and the passive element 32 are mounted on the substrate 1. The substrate 1 is made of a single crystal intrinsic semiconductor material. The intrinsic semiconductor material of the present embodiment is Si. In the top view, the substrate 1 is a rectangular shape with a long side in the first direction x. The substrate 1 has a substrate main surface 11, a back surface 12, and a recess 13.

Figure 5:
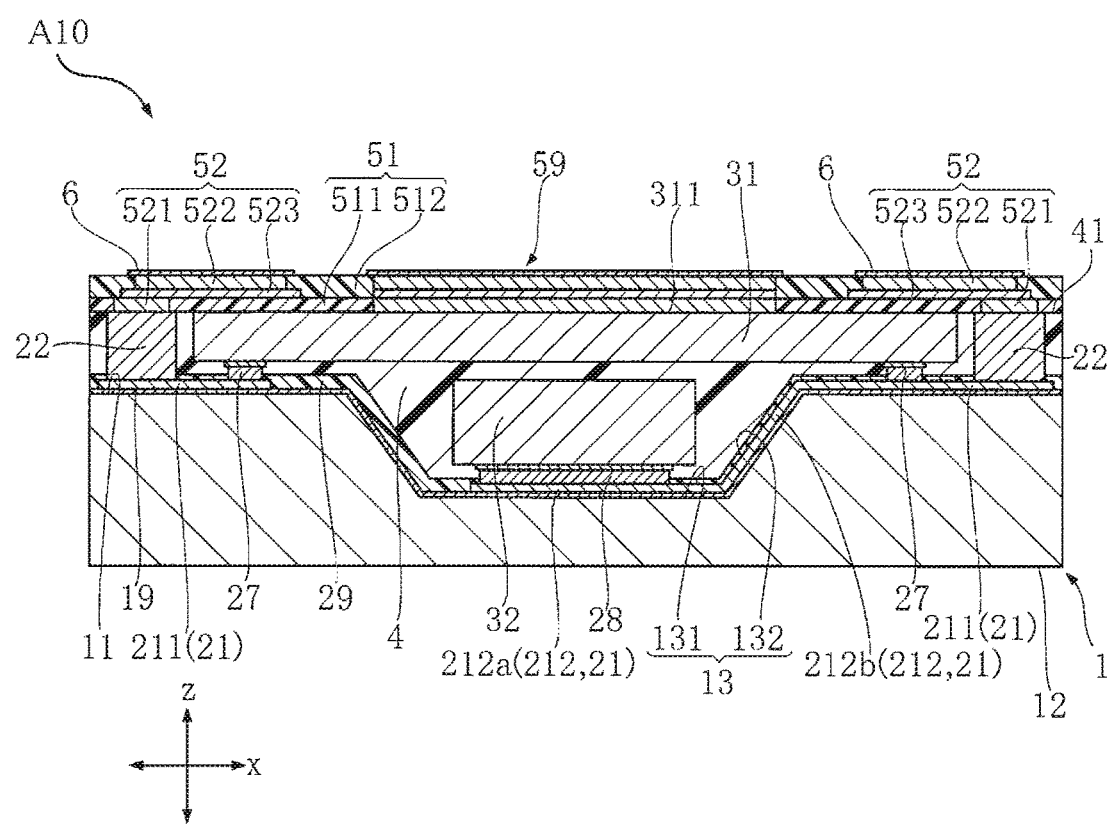
FIG. 5 is a cross-sectional view taken along line V-V in FIG. 2.
Figure 6:
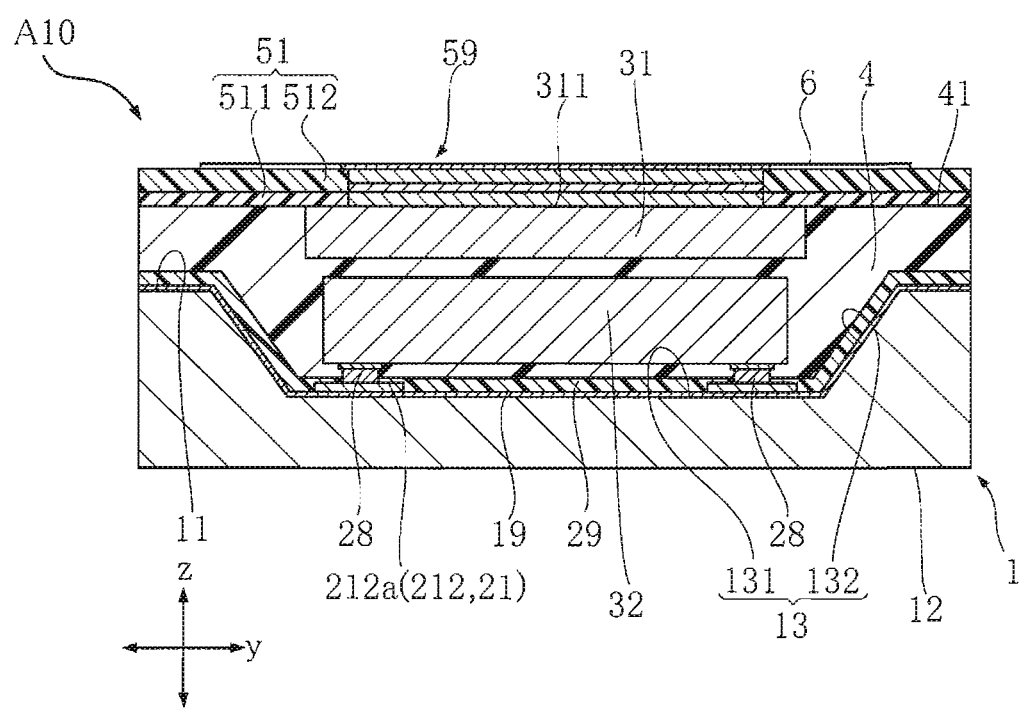
FIG. 6 is a cross-sectional view taken along line VI-VI in FIG. 2.

As shown in FIG. 5 and FIG. 6, the substrate main surface 11 faces the thickness direction z. In the top view, the substrate main surface 11 is a frame shape surrounding the recess 13. A first wiring layer 211 (details will be described below) of the internal wiring layer 21 and the columnar conductor 22 are disposed on the substrate main surface 11.

As shown in FIG. 5 and FIG. 6, the back surface 12 faces the side opposite to the substrate main surface 11 in the thickness direction z. The back surface 12 is a rectangular shape, and is exposed to the outside. When the semiconductor device A10 is mounted on the circuit board, the back surface 12 faces the same direction as the circuit board.

As shown in FIG. 4-FIG. 6, the recess 13 is a cavity area formed in the substrate 1, and recessed from the substrate main surface 11. A second wiring layer 212 (details will be described below) of the internal wiring layer 21 is disposed on the recess 13. In the present embodiment, the passive element 32 is accommodated in the recess 13, and the sealing resin 4 is filled in the recess 13. The recess 13 has a bottom surface 131 and middle surface 132.

As shown in FIG. 4-FIG. 6, the bottom surface 131 is disposed between the substrate main surface 11 and the back surface 12 in the thickness direction z, and is parallel with respect to the substrate main surface 11. The bottom surface 131 is a rectangular shape.

As shown in FIG. 4-FIG. 6, the middle surface 132 is connected to both the bottom surface 131 and the substrate main surface 11, and inclined with respect to the bottom surface 131. The middle surface 132 comprises four planes surrounding the four sides which are the edges of the bottom surface 131. The tilt angles of the respective middle surfaces 132 with respect to the bottom surface 131 are the same, and the tile angle is 54.74°. Therefore, in the substrate made of the intrinsic semiconductor material, the substrate main surface 11 is set as the (100) plane, and the middle surface 132 is set as the (111) plane.

As shown in FIG. 5-FIG. 8, the internal insulating film 19 covers the substrate main surface 11, the bottom surface 131 of the recess 13 and the middle surface 132 of the recess. The internal insulating film 19 is made of the material having electrical insulation and excellent thermal conductivity. In the present embodiment, the internal insulating film 19 comprises Aluminium Nitride (AlN). In addition to AlN, the internal insulting film 19 can also comprise Silicon Nitride ($Si_3N_4$), for example.

Figure 7:
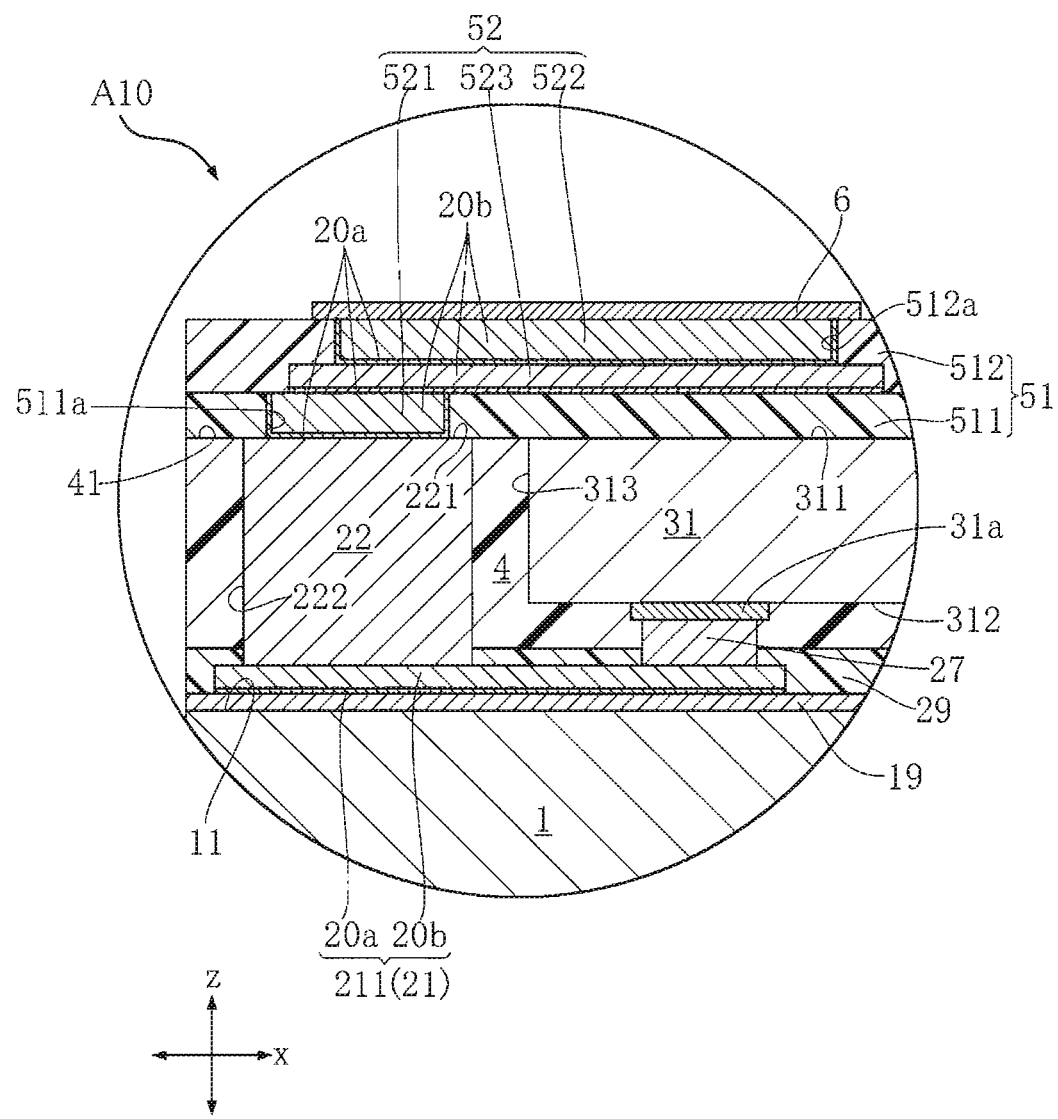
FIG. 7 is a partial enlarged view of FIG. 5.
Figure 8:
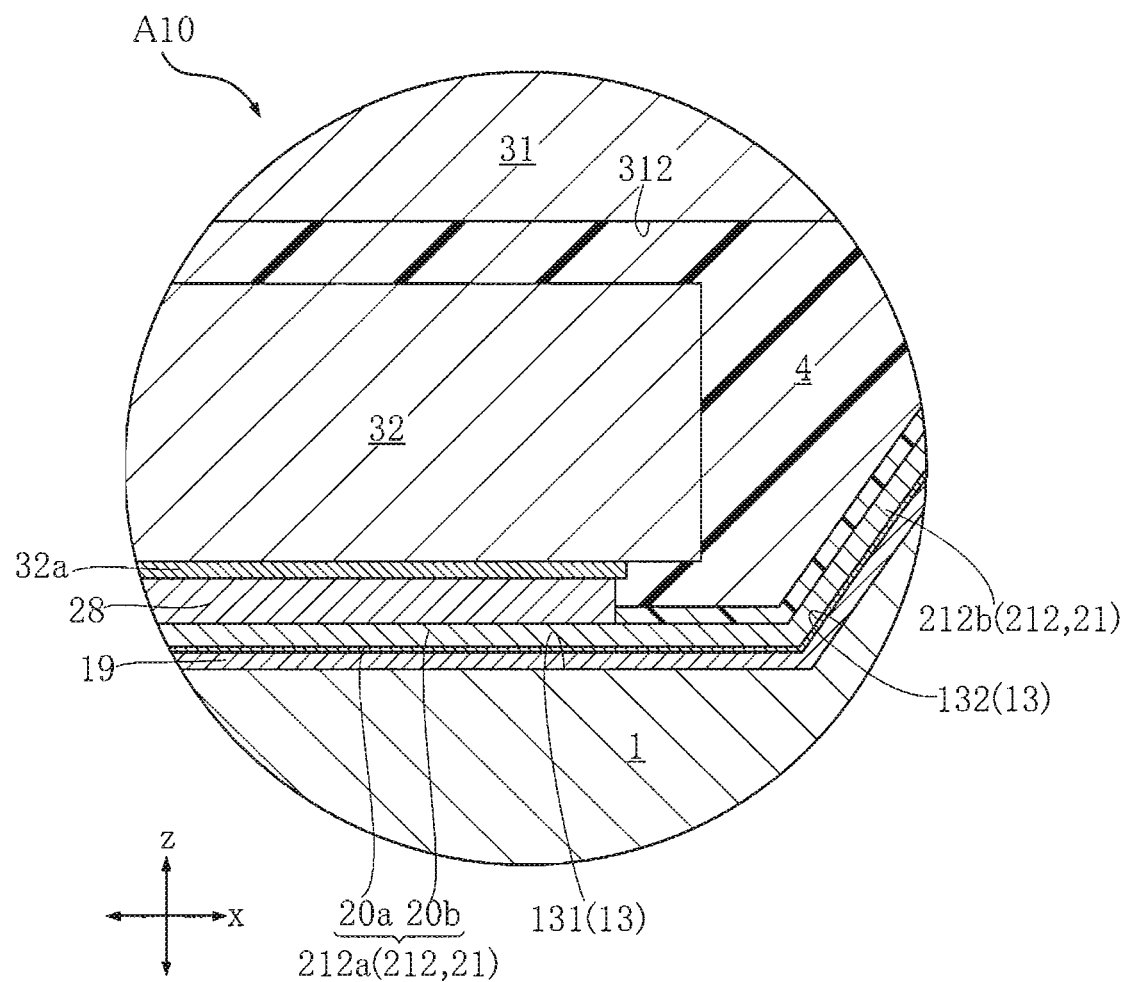
FIG. 8 is a partial enlarged view of FIG. 5.

As shown in FIG. 4- FIG. 6, the internal wiring layer 21 is a conductive member disposed on the substrate main surface 11 and the recess 13. The internal wiring layer 21 is in contact with a surface of the internal insulating film 19. As shown in FIG. 7 and FIG. 8, the internal wiring layer 21 is formed of a base layer 20a and a plating layer 20b laminated to each other. The base layer 20a is a metal layer in contact with a surface of the internal insulating film 19, and has a thickness of 200~300 nm. The base layer 20a is made of a Ti layer and a Cu layer laminated to each other, and the Ti layer is in contact with the internal insulating film 19. The plating layer 20b is a metal layer in contact with the Cu layer of the base layer, and has a thickness of 3~10 μm. Therefore, the thickness of the plating layer 20b is set to be more than the thickness of the base layer 20a. The plating layer 20b comprises Cu. The internal wiring layer 21 includes the first wiring layer 211 and the second wiring layer 212.

As shown in FIG. 4-FIG. 6, the first wiring layer 211 is disposed on the substrate main surface 11. In the present embodiment, the first wiring layers 211 are disposed in six places, and in the form of a band extending in the first direction x.

As shown in FIG. 4-FIG. 6, the second wiring layer 212 is disposed on the recess 13. In the present embodiment, the second wiring layers 212 are disposed in two places, and in the form of a band extending in the first direction x in the top view. The second wiring layer 212 has a bottom surface portion 212a and a middle surface portion 212b. The bottom surface portion 212a is disposed on the bottom surface 131 of the recess 13. The middle surface portion 212b is disposed on the middle surface 132 of the recess 13. The middle surface portion 212b is connected to both the bottom surface portion 212a and the first wiring layer 211.

As shown in FIG. 3-FIG. 6, the columnar conductor 22 is a conductive member disposed on the first wiring layer 211. The columnar conductor 22 protrudes from the first wiring layer 211 toward the direction (thickness direction z) in which the substrate main surface 11 faces. The columnar conductor 22 comprises Cu. In the present embodiment, the columnar conductors 22 are disposed in four places which are all located on the outer periphery of the semiconductor element 31 in the top view. In the present embodiment, the columnar conductor 22 is a prism. In addition to the prism, the columnar conductor 22 can also be a cylinder, for example. The columnar conductor 22 has a top surface 221 and a lateral surface 222. The top surface 221 faces the same direction (thickness direction z) as the substrate main surface 11. The top surface 211 is exposed from the sealing resin 4. The lateral surface 222 faces the direction perpendicular to the thickness direction z. In the present embodiment, the lateral. surface 222 comprises four planes, and each lateral surface 222 faces one of the first direction x and the second direction y. As shown in FIG. 7, the lateral surfaces are all covered by the sealing resin 4.

As shown in FIG. 3-FIG. 5 and FIG. 7, a first bonding layer 27 is a conductive member disposed on the first wiring layer 211. The first bonding layer 27 protrudes from the first wiring layer 211 toward the direction (thickness direction z) in which the substrate main surface 11 faces, and is disposed away from the columnar conductor 22. The first bonding layer 27 comprises a Ni layer and an alloy layer containing Sn as a main component laminated with each other. The Ni layer is disposed between the first wiring layer 211 and the alloy layer. Further, the alloy layer is, for example, a lead-free solder such as a Sn—Sb alloy or a Sn—Ag alloy. In the present embodiment, the first bonding layers 27 are disposed in five places, which are all located between the recess and the columnar conductor 22 in the top view. In the present embodiment, the first bonding layer 27 is a rectangular shape.

As shown FIG. 4-FIG. 6 and FIG. 8, a second bonding layer 28 is a conductive member disposed on the bottom surface portion 212a of the second wiring layer 212. The second bonding layer 28 protrudes toward an inner side of the recess 13. The second bonding layer 28 comprises a Ni layer and an alloy layer containing Sn as a main component laminated with each other. The Ni layer is disposed between the bottom surface portion 212a and the alloy layer. Further, the alloy layer is, for example, a lead-free solder such as a Sn—Sb alloy or a Sn—Ag alloy. in the present embodiment, the second bonding layers 28 are disposed in two places, and are both rectangular shapes extending in the first direction x. Further, the second bonding layer 28 can be disposed on the middle surface portion 212b of the second wiring layer 212.

As shown in FIG. 4-FIG. 8, the first wiring layer 211 and the second wiring layer 212 are covered by a protecting film 29. In the present embodiment, a portion of the internal insulating film 19 on which no first wiring layer 211 and no second wiring layer 212 are disposed is also covered by the protecting film 29. The protecting film 29 is made of the material having electrical insulation and heat resistance. The material is polyimide, for example. As shown in FIG. 7 and FIG. 8, a portion of each of the columnar conductor 22, the first bonding layer 27 and the second bonding layer 28 protrudes from the protecting film 29.

Figure 3:
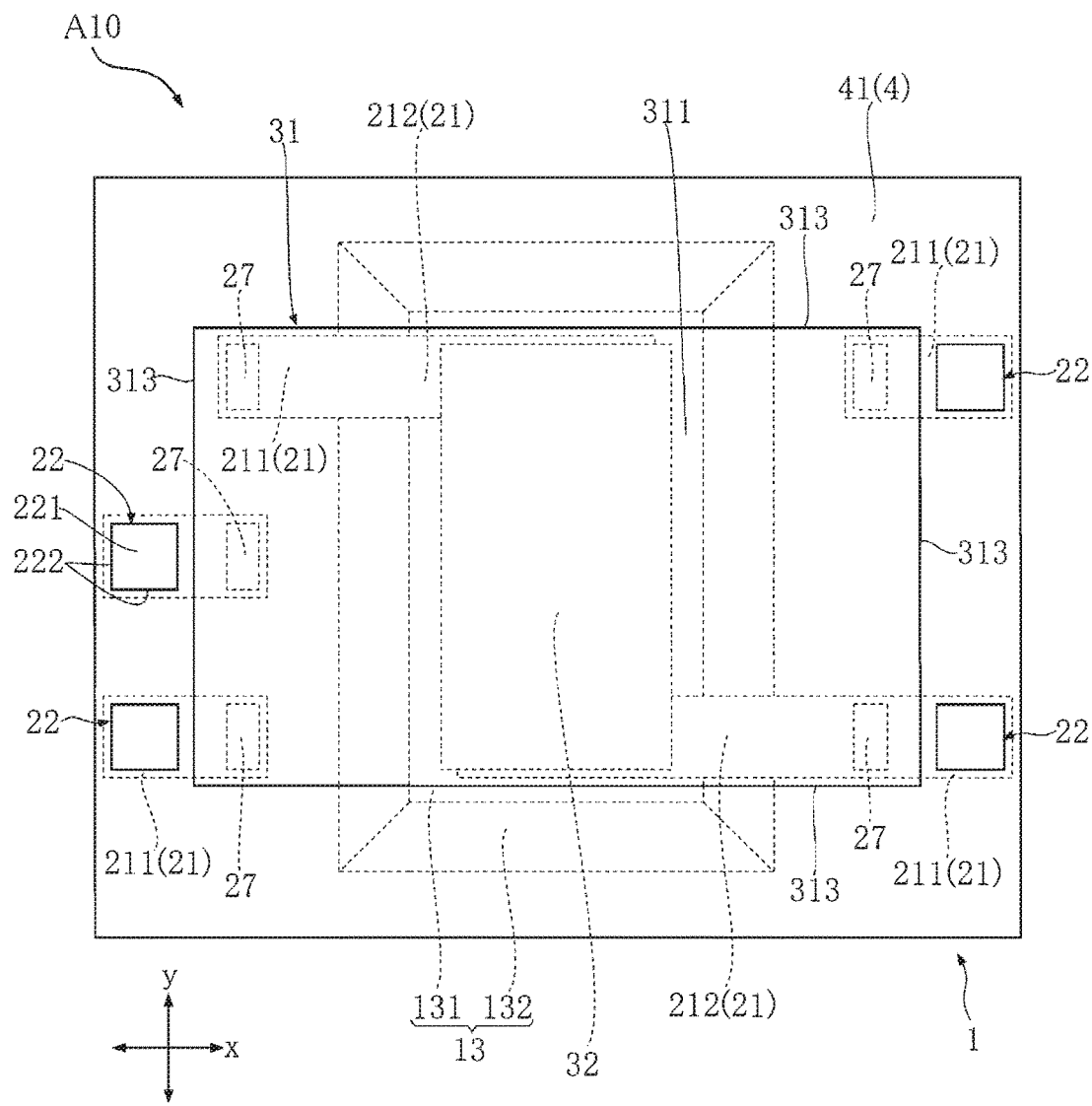
FIG. 3 is a top view of the semiconductor device shown in FIG. 1 (omitting the external insulating film, the external wiring layer, the heat dissipating layer and the terminal).
Figure 4:
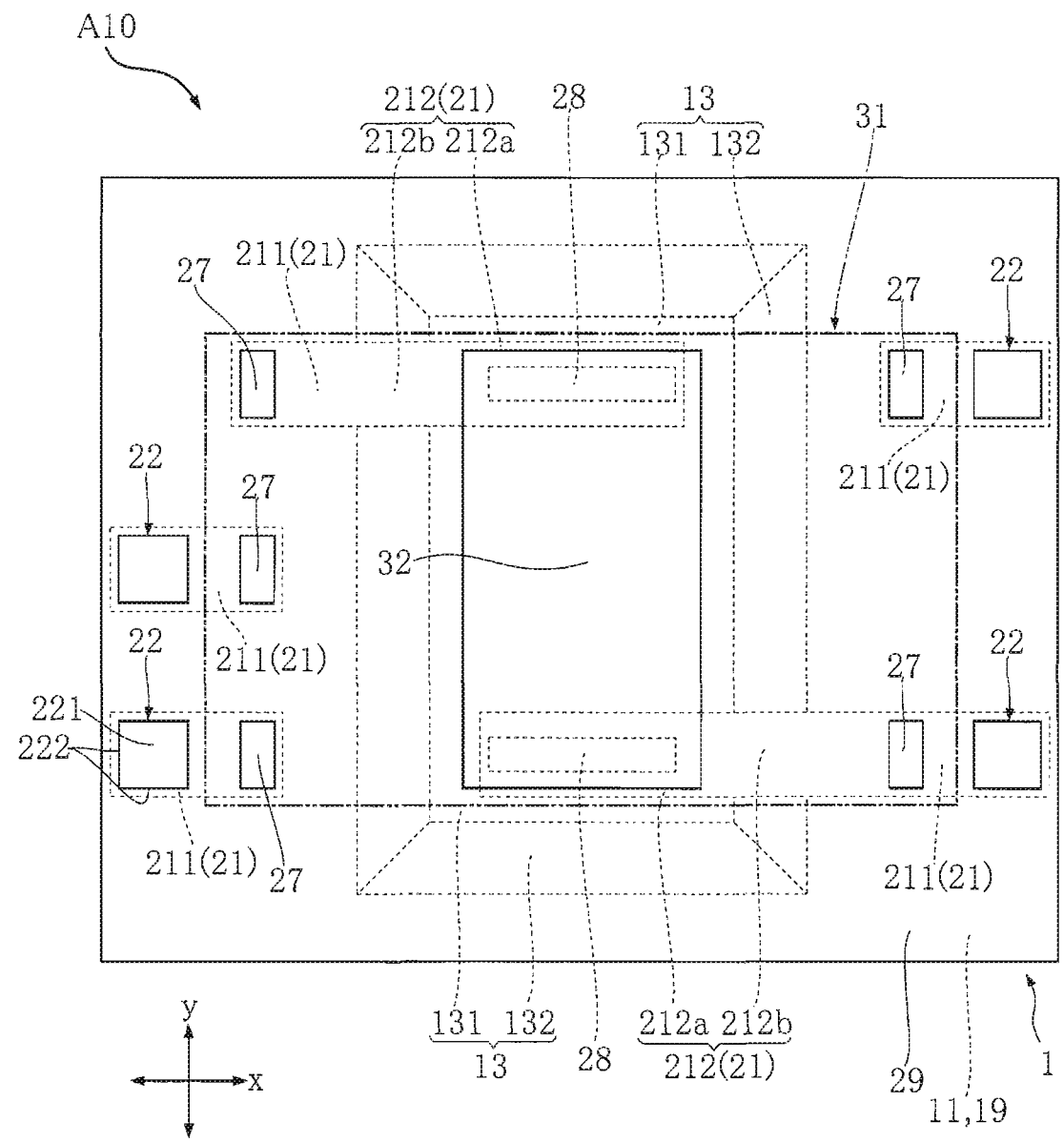
FIG. 4 is a top view of the semiconductor device shown in FIG. 1 (showing the semiconductor element and omitting the sealing resin, the external insulating film, the external wiring layer, the heat dissipating layer and the terminal).

As shown in FIG. 3, FIG. 5 and FIG. 7, the semiconductor element 31 is electrically connected to the internal wiring layer 21. In the top view, semiconductor element 31 has a portion overlapping the recess 13. In the present embodiment, the semiconductor element 31 is in contact with the first bonding layer 27, and is mounted on the first wiring layer 211 in a state of crossing the recess 13 in the top view. The semiconductor element 31 is a so-called flip-chip element. In the present embodiment, the accommodating space of the semiconductor element 31 is formed by the columnar conductor 22. The semiconductor element 31 of the present embodiment is, for example, an integrated circuit (IC) formed with a circuit for driving a switching element such as a MOSFET (Metal Oxide Semiconductor Field Effect Transistor). Further, the semiconductor device 31 is not limited to this and may be an element with various circuits. The semiconductor element 31 has an element main surface 311, an element back surface 312 and an element lateral surface 313.

As shown in FIG. 3 and FIG. 5-FIG. 7, the element main surface 311 faces the same direction (thickness direction z) as the substrate main surface 11. The element main surface 311 is exposed from the sealing resin 4. Further, a heat dissipating layer 59 is disposed in the center of the element main surface 311. The element back surface 312 faces the side opposite to the element main surface 311 in the thickness direction z, and opposes the substrate main surface 11 and the recess 13. As shown in FIG. 7, a plurality of electrode bumps 31a are disposed on the element back surface 312. Each electrode bump 31a is in contact with the first bonding layer 27. The electrode bump 31a of the present embodiment comprises A1. As shown in FIG. 3 and FIG. 7, the element lateral surface 313 faces the direction perpendicular to the thickness direction z. In the present embodiment, the element lateral surface 313 comprises four planes, and each element lateral surface 313 faces one of the first direction x and the second direction y. The element back surface 312 and the element lateral surface 313 are both covered by the sealing resin 4.

As shown in FIG. 4-FIG. 6 and FIG. 8, the passive element 32 is mounted on the bottom surface portion 212a of the second wiring layer 212, and accommodated in the recess 13. The passive element 32 is a so-called flip-chip element bonded to the second bonding layer 28. An electrode bump 32a is disposed on a back surface of the passive element 32, and is bonded to the second bonding layer 28. The passive element 32 of the present embodiment is a thin film chip inductor. Further, the passive element 32 can also be a capacitor, a crystal oscillator, or the like. Further, in the case that the second bonding layer 28 is disposed on the middle surface portion 212b of the second wiring layer 212, the passive element 32 is mounted on the middle surface portion 212b.

As shown in FIG. 3 and FIG. 5-FIG. 7, the sealing resin 4 is filled into the recess 13, and covers a portion of each of the columnar conductor 22 and the semiconductor element 31. The sealing resin 4 is a synthetic resin having electrical insulation, such as a black epoxy resin. The sealing resin 4 has a resin main surface 41. The resin main surface 41 faces the same direction (thickness direction z) as the substrate main surface 11. The top surface 221 of the columnar conductor 22 and the element main surface 311 of the semiconductor element 31 are the same as the resin main surface 41.

As shown in FIG. 5-FIG. 7, a portion of the element main surface 311 of the semiconductor element 31 and the resin main surface 41 of the sealing resin 4 are covered by the external insulating film 51. The external insulating film 51 is made of photosensitive polyimide, which is the material having electrical insulation and heat resistance. The external insulating film 41 has a first insulating film 511 and a second insulating film 512 laminated with each other. The first insulating film 511 is in contact with a portion of the element main surface 311 and the resin main surface 41. As shown in FIG. 2 and FIG. 7, a first opening portion 511a penetrating the first insulating film 511 along the thickness direction z to the top surface 221 of the columnar conductor 22 is formed on the first insulating film 511. The second insulating film 512 is in contact with the first insulating film 511, and exposed to the outside. As shown in FIG. 2 and FIG. 7, a second opening portion 512a penetrating the second insulating film 512 along the thickness direction z is formed on the second insulating film 512.

As shown in FIG. 2, FIG. 5 and FIG. 7, the external wiring layer 52 is a conductive member disposed inside the first insulating film 511 and the second insulating film 512, and connects the columnar conductor 22 to the terminal 6. In the present embodiment, the external wiring layers 52 are disposed in four places. The external wiring layer 52 has a first embedded portion 521, a second embedded portion 522 and an intermediate portion 523.

As shown in FIG. 2, FIG. 5 and FIG. 7, the first embedded portion 521 is embedded in the first opening portion 511a formed in the first insulating film 511, and is in contact with the top surface 221 of the columnar conductor 22. Similarly to the internal wiring layer 21, the first embedded portion 521 comprises a base layer 20a and a plating layer 20b laminated with each other. The materials of the base layer 20a and the plating layer 20b are the same as those of the internal wiring layer 21. In the first embedded portion 521, the base layer 20a is in contact with the top surface 221. In the present embodiment, the first embedded portion 521 is a prism. In addition to the prism, the first embedded portion 521 can also be a cylinder, for example.

As shown in FIG. 2, FIG. 5 and FIG. 7, the second embedded portion 522 is embedded in the second opening portion 512a formed in the second insulating film 512, and is in contact with the terminal 6. Similarly to the internal wiring layer 21, the second embedded portion 522 comprises the base layer 20a and the plating layer 20b laminated with each other. The materials of the base layer 20a and the plating layer 20b are the same as those of the internal wiring layer 21. In the second embedded portion 522, the plating layer 20b is in contact with the terminal 6. In the present embodiment, the second embedded portion 522 is a prism. In addition to the prism, the second embedded portion 522 can also be a cylinder, for example.

As shown in FIG. 2, FIG. 5 and FIG. 7, the intermediate portion 523 is disposed between the first insulating film 511 and the second insulating film 512, and connected to both the first embedded portion 521 and the second embedded portion 522. Similarly to the internal wiring layer 21, the intermediate portion 523 comprises the base layer 20a and the plating layer 20b laminated with each other. The materials of the base layer 20a and the plating layer 20b are the same as those of the internal wiring layer 21. In the intermediate portion 523, the base layer 20a is in contact with both the first embedded portion 521 and the first insulating film 511, and the plating layer 20b is in contact with the second embedded portion 522. In the top view, the intermediate portion 523 is a rectangular shape. Further, in the case that all the second embedded portions 522 have a portion overlapping the first embedded portion 521, the arrangement of the intermediate portion 523 can be omitted.

Figure 9:
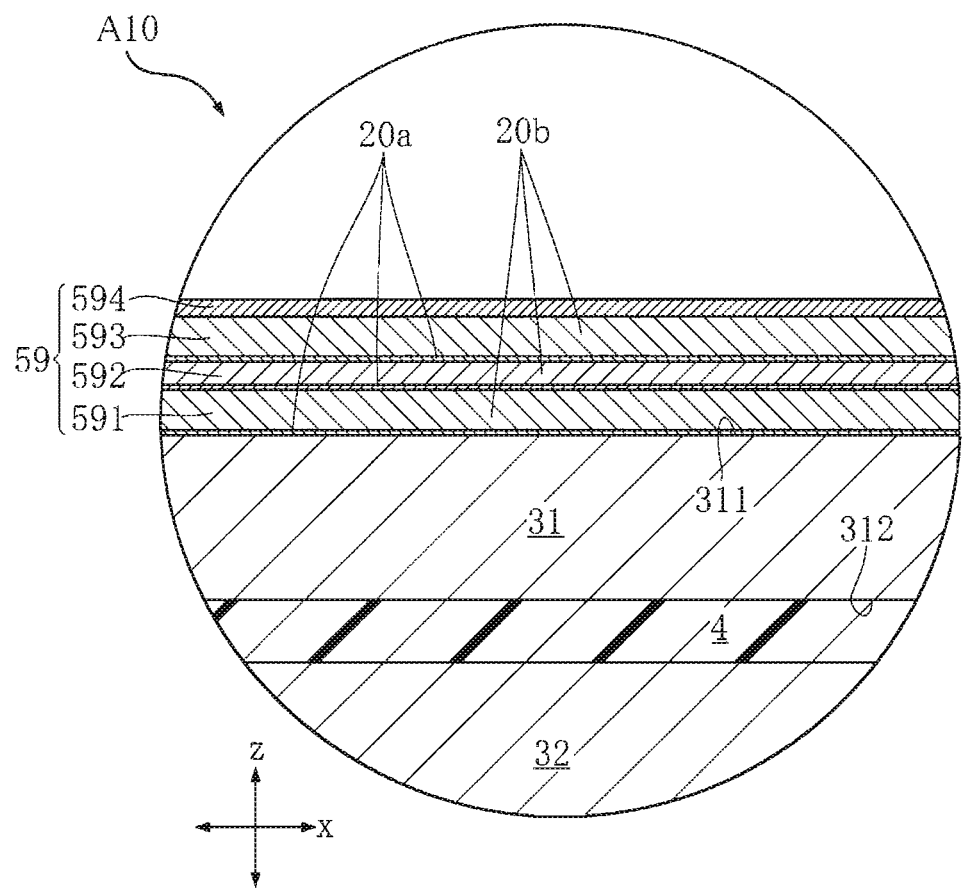
FIG. 9 is a partial enlarged view of FIG. 5.

As shown in FIG. 2, FIG. 5 and FIG. 6, the heat dissipating layer 59 is arranged to be in contact with the element main surface 311 of the semiconductor element 31 and exposed to the outside. In the top view, the heat dissipating layer 59 is disposed in the center of the semiconductor element 31, and exposed from the external insulating film 51. As shown in FIG. 9, the heat dissipating layer 59 comprises a first layer 591, a second layer 592, a third layer 593 and a fourth layer 594 laminated with each other.

As shown in FIG. 9, the first layer 591 is in contact with the element main surface 311. The material of the first layer 591 is the same as that of the first embedded portion 521 of the external wiring layer 52, and has the same thickness as that of each of the first insulating film 511 and the first embedded portion 521. The second layer 592 is in contact with the first layer 591. The material of the second layer 592 is the same as that of the intermediate portion 523 of the external wiring layer 52, and has the same thickness as that of the intermediate portion 523. The third layer 593 is in contact with the second layer 592. The material of the third layer 593 is the same as that of the second embedded portion 522 of the external wiring layer 52, and has the same thickness of that of the second embedded portion 522. The sum of the thickness of the second layer 592 and the thickness of the third layer 593 is the same as the thickness of the second insulating film 512. The fourth layer 594 is in contact with the third layer 593, and exposed to the outside. The material of the fourth layer 594 is the same as that of the terminal 6, and has the same thickness as that of the terminal 6. Further, in the case that the arrangement of the intermediate portion 523 in the external wiring layer 52 is omitted, the arrangement of the second layer 592 is omitted together. Further, the arrangement of the fourth layer 594 is omitted. In this case, the third layer 593 is exposed to the outside.

As shown in FIG. 2 and FIG. 5-FIG. 7, the terminal 6 is a conductive member electrically connected to the columnar conductor 22 via the external wiring layer 52 and connected to the outside. Similarly to the heat dissipating layer 59, the terminal 6 is exposed from the external insulating film 51. When the semiconductor device A10 is mounted, solder paste or the like is attached to the terminal 6. The terminal 6 of the present embodiment comprises a Ni layer, a Pd layer and an Au layer laminated with each other. In this case, the Ni layer is in contact with the first embedded portion 521 of the external wiring layer 52, the Au layer is exposed to the outside, and the Pd layer is disposed between the Ni layer and the Au layer. In the present embodiment, the terminals 6 are disposed in four places, which are all located on the outer periphery of the heat dissipating layer 59 in the top view.

Then, based on FIG. 10-FIG. 30, an example of a method for fabricating the semiconductor device A10 is illustrated.

The cross-sectional positions and ranges of FIG. 10 and FIG. 12-FIG. 29 are the same as those of FIG. 5. The thickness direction z of the substrate 80, the first direction x and the second direction y shown in FIG. 10-FIG. 30 are corresponding to the thickness direction z, the first direction x and the second direction y shown in FIG. 1-FIG. 6.

Figure 10:
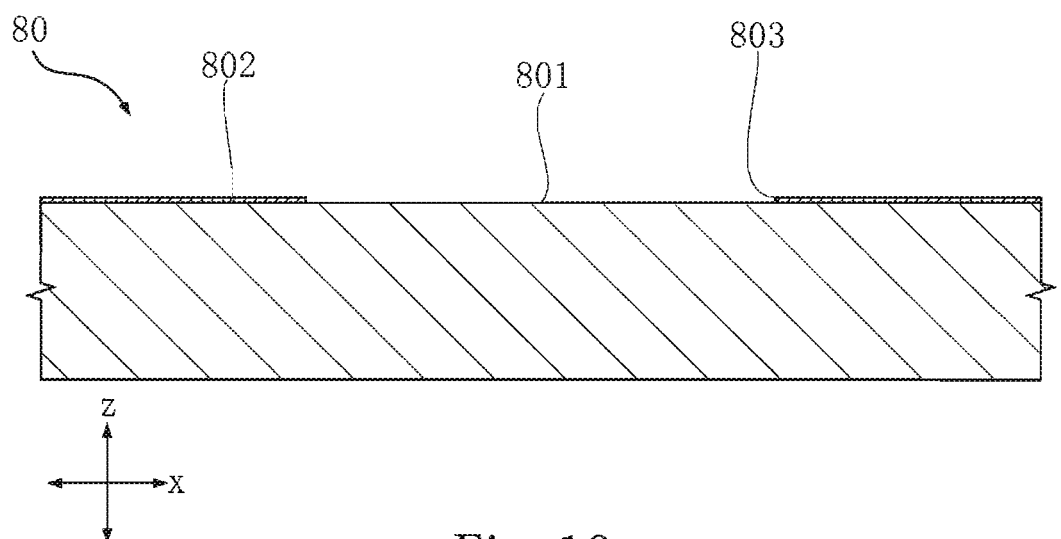
FIG. 10 is a cross-sectional view showing the step of fabricating the semiconductor device shown in FIG. 1.
Figure 11:
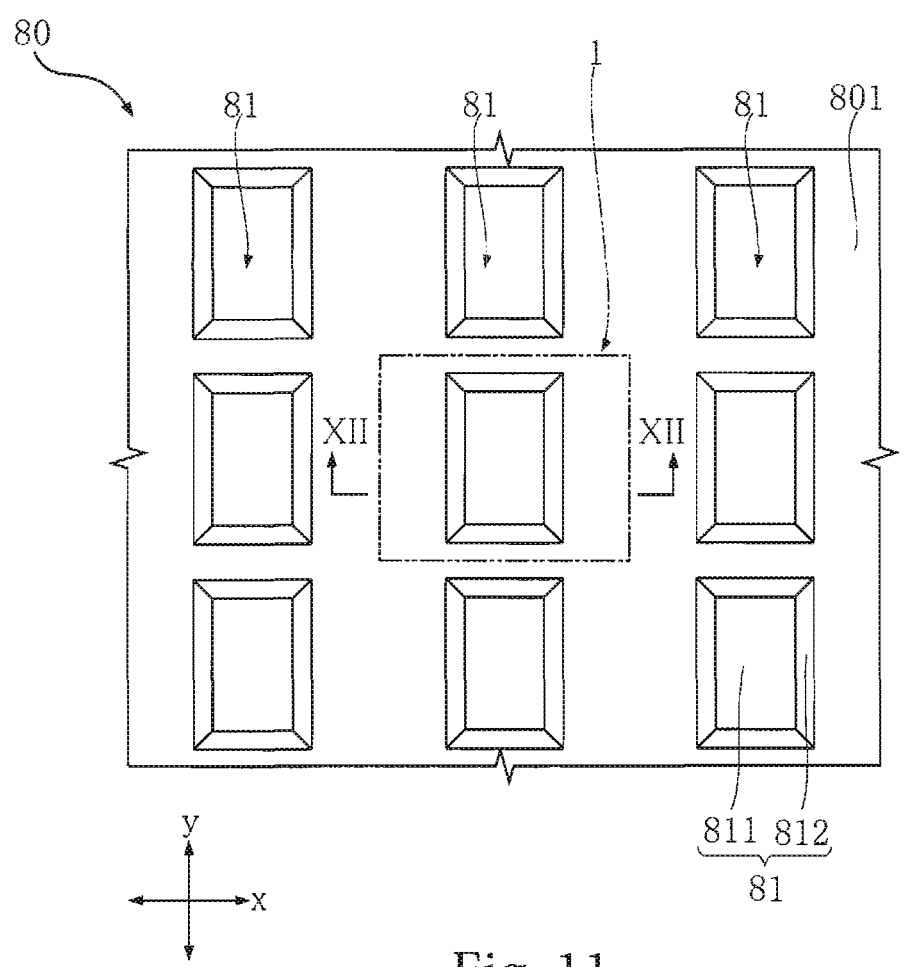
FIG. 11 is a cross-sectional view showing the step of fabricating the semiconductor device shown in FIG. 1.
Figure 12:
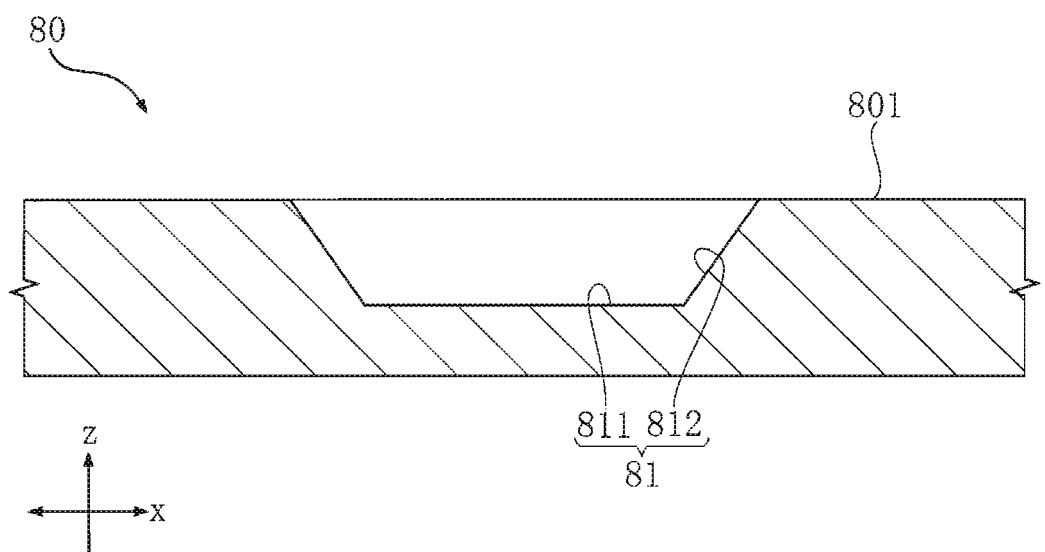
FIG. 12 is a cross-sectional view taken along line XII-XII in FIG. 11.

First, as shown in FIG. 10-FIG. 12, on a substrate 80 having a main surface 801 facing a thickness direction z and made of a single crystal intrinsic semiconductor material, a recess 81 recessed from the main surface is formed. The substrate 80 is corresponding to an assembly of a portion of the substrate 1 of the semiconductor device A10. The intrinsic semiconductor material of the substrate 80 of the present embodiment is Si. For example, the substrate 80 is a silicon wafer. The recess 81 is formed according to the following sequence.

First, as shown in FIG. 10, a first insulating film 802 is formed on the main surface 801 of the substrate 80. The first insulating film 802 of the present embodiment is, for example, a thin film comprising $Si_3N_4$, and is formed by chemical vapor deposition (CVD). In this case, the main surface 801 is a (100) plane, and the whole surface of the main surface 801 is covered by the first insulating film 802. Then, after a mask is formed on the first insulating film 802 by photolithography, the first insulating film 802 is partially removed by reactive ion etching (RIE), which is a typical example of dry etching. In the case that the first insulating film 802 comprises $Si_3N_4$, $CF_4$ is used as an etching gas, for example. As a result, an opening portion 803 that is a rectangular shape in the top view is formed on the first insulating film 802. The main surface 801 is exposed from the opening portion 803.

Then, as shown in FIG. 11 and FIG. 12, a recess 81 recessed from the main surface 801 exposed from the opening portion 803 is formed on the substrate 80. The recess 81 is corresponding to the recess 13 of the substrate 1 of the semiconductor device 410. The recess 81 has a bottom surface 811 parallel to the main surface 801 and being a rectangular shape, and four middle surfaces 812 connected to both the bottom surface 811 and the main surface 801 and inclined with respect to the bottom surface 811. The recess 81 is formed by an anisotropic etching using an alkaline solution. The solution is KOH solution or tetramethyl ammonium hydroxide (TMAH) solution. In this case, each middle surface 812 is a (111) plane. After the recess 81 is formed, the first insulating film 802 formed on the substrate 80 is completely removed. In the case that the first insulating film 802 comprises $Si_3N_4$, the first insulating film 802 is removed by reactive ion etching using $CF_4$ as the etching gas or wet etching using a heated phosphoric acid solution. At this time, as shown in FIG. 11, there are a plurality of recesses 81 separated from each other and a main surface 801 surrounding the respective recesses 81 on the substrate 80. In FIG. 11, a range corresponding to the substrate 1 of the semiconductor device A10 is represented by an imaginary line. The recess 81 is formed according the above sequence.

Figure 13:
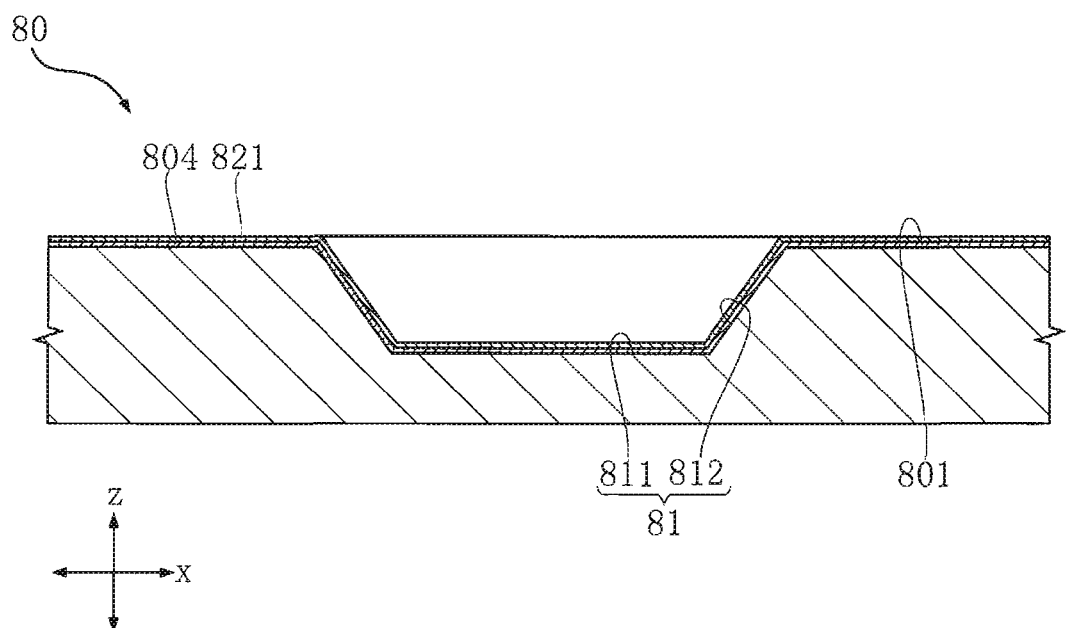
FIG. 13 is a cross-sectional view showing the step of fabricating the semiconductor device shown in FIG. 1.

Then, as shown in FIG. 13, a second insulating film 804 in contact with the main surface 801 and the recess 81 and a first base layer 821 in contact with the second insulating film 804 are formed, respectively. The second insulating film 804 is corresponding to the internal insulating film 19 of the semiconductor device A10. The second insulating film 804 is a thin film comprising AlN, and formed by CVD, for example. Further, the second insulating film 804 can be designed as a thin film comprising $Si_3N_4$, and in this case, similarly to the first insulating film 802, the second insulating film 804 is formed by plasma CVD. Further, the first base layer 821 is a Ti layer and a Cu layer laminated with each other and formed by sputtering, respectively. While forming the first base layer 821, the Ti layer is formed first, and then the Cu layer is formed.

Figure 14:
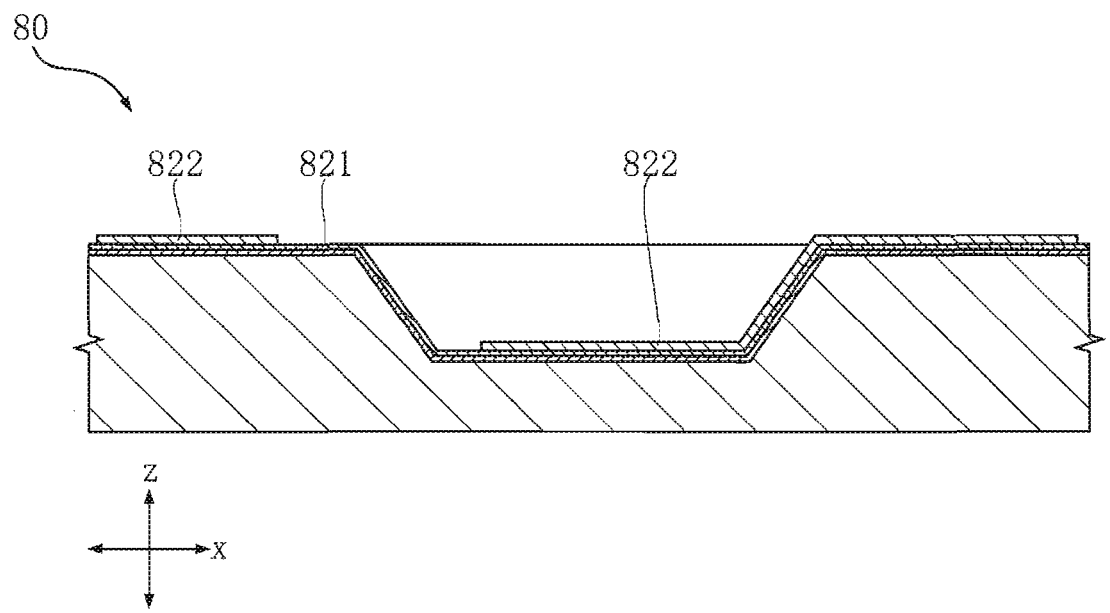
FIG. 14 is a cross-sectional view showing the step of fabricating the semiconductor device shown in FIG. 1.

Then, as shown in FIG. 14, a first plating layer 822 is formed to be in contact with the first base layer 821. The first plating layer 822 comprises Cu. Photolithography is performed to form patterns and electrolytic plating is performed by using the first base layer 821, so as to form the first plating layer 822. The first plating layer 822 is formed on the base layer 821, which is exposed from a patterned resist layer (not shown). After the first plating layer 822 is formed, the resist layer is removed.

Figure 15:
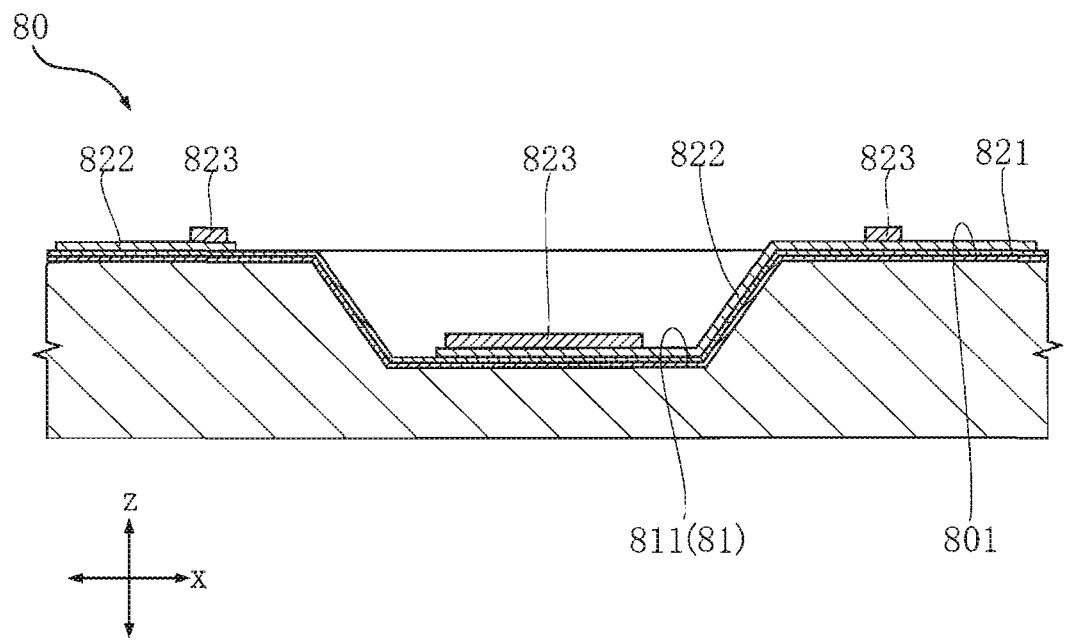
FIG. 15 is a cross-sectional view showing the step of fabricating the semiconductor device shown in FIG. 1.

Then, as shown in FIG. 15, a bonding layer 823 is formed to be in contact with the first plating layer 822 disposed on the main surface 801 and the recess 81. The bonding layer 823 comprises a Ni layer and an alloy layer containing Sn as a main component laminated with each other. Photolithography is performed to form patterns and electrolytic plating is performed by using the first base layer 821, so as to form the bonding layer 823. The bonding layer 823 is formed on the first plating layer 822, which is exposed from a patterned resist layer (not shown). While forming the bonding layer 823, the Ni layer is formed first, and then the alloy layer is formed. After the bonding layer 823 is formed, the resist layer is removed.

Figure 16:
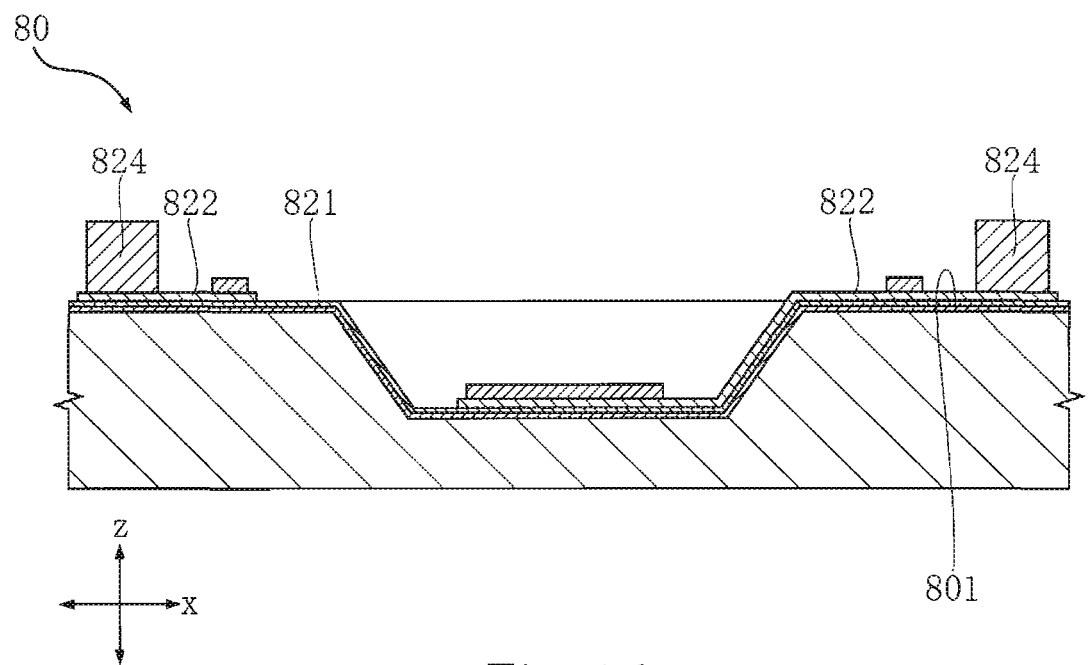
FIG. 16 is a cross-sectional view showing the step of fabricating the semiconductor device shown in FIG. 1.

Then, as shown in FIG. 16, a columnar member 824 is formed to be in contact with the first plating layer 822 on the main surface 801. The columnar member 824 comprises Cu. Photolithography is performed to form patterns and electrolytic plating is performed by using the first base layer 821, so as to form the columnar member 824. The columnar member 824 is formed on the first plating layer 822, which is exposed from a patterned resist layer (not shown). After the columnar member 824 is formed, the resist layer is removed.

Figure 17:
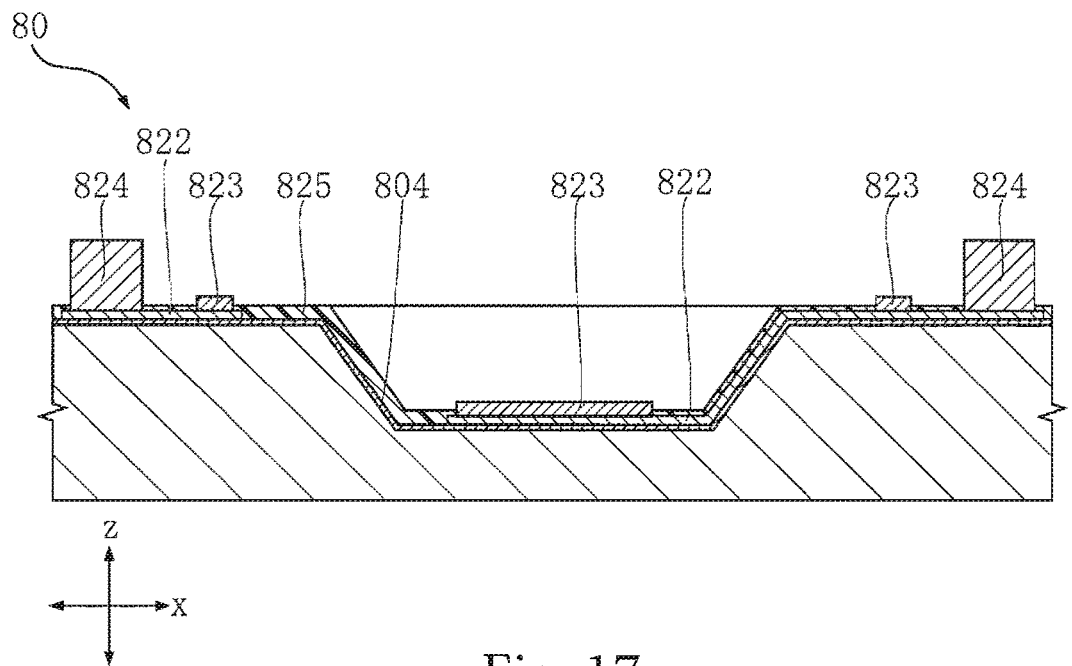
FIG. 17 is a cross-sectional view showing the step of fabricating the semiconductor device shown in FIG. 1.

Then, as shown in FIG. 17, after the first base layer 821 which is not covered by the first plating layer 822 is removed, a protecting film 825 is formed to cover the second insulating film 804 and the first plating layer 822. The protecting film 825 is corresponding to the protecting film 29 of the semiconductor device A10. First, the first base layer 821 is removed by, for example, wet etching. In the wet etching, the mixed solution using $H_2SO_4$ and $H_2O_2$, for example, is used. The second insulating film 804 appears from the portion where the first base layer 821 is removed. Then, the protecting film 825 is formed. For example, the photosensitive polyimide is coated on the main surface 801 and the recess 81 by using a spin coater (rotary coating apparatus), and then exposure and development of photolithography are performed so as to form the protecting film 825. By the exposure and the development, a portion of each of the bonding layer 823 and the columnar member 824 is exposed. In the case the protecting film 825 is completely formed, the first base layer 821 and the first plating layer 822 which are laminated with each other are corresponding to the internal wiring layer 21 of the semiconductor device A10, and the bonding layer 823 is corresponding to the first bonding layer 27 and the second bonding layer 28 of the semiconductor device A10.

Figure 18:
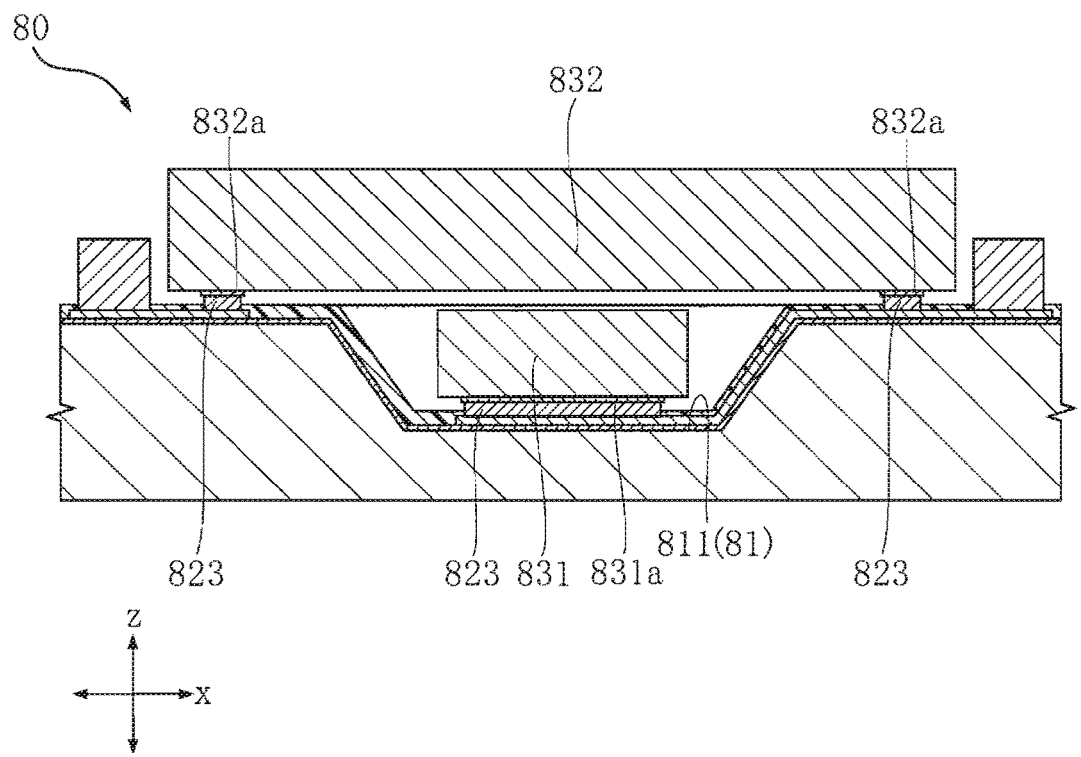
FIG. 18 is a cross-sectional view showing the step of fabricating the semiconductor device shown in FIG. 1.

Then, as shown in FIG. 18, a first element 831 and a second element 832 are bonded to the bonding layer 823. The first element 831 is corresponding to the passive element 32 of the semiconductor device A10. Further, the second element 832 is a semiconductor element. The first element 831 and the second element 832 are bonded to the bonding layer 823 by flip-chip bonding. First, after soldering flux is coated on the electrode bump 831a of the first element 831, the first element 831 is temporarily attached to the bonding layer 823 disposed on the bottom surface 811 of the recess 81 by using a flip-chip bonder. At this time, the first element 831 is accommodated in the recess 81. Then, after soldering flux is coated on the electrode bump 832a of the second element 832, the second element 832 is temporarily attached to the bonding layer 823 disposed on the main surface 801 by using a flip-chip bonder. Then, the bonding layer 823 is melted by reflow, and then the bonding layer 823 is cured by cooling, whereby the bonding of the first element 831 and the second element 832 to the bonding layer 823 is completed.

Figure 19:
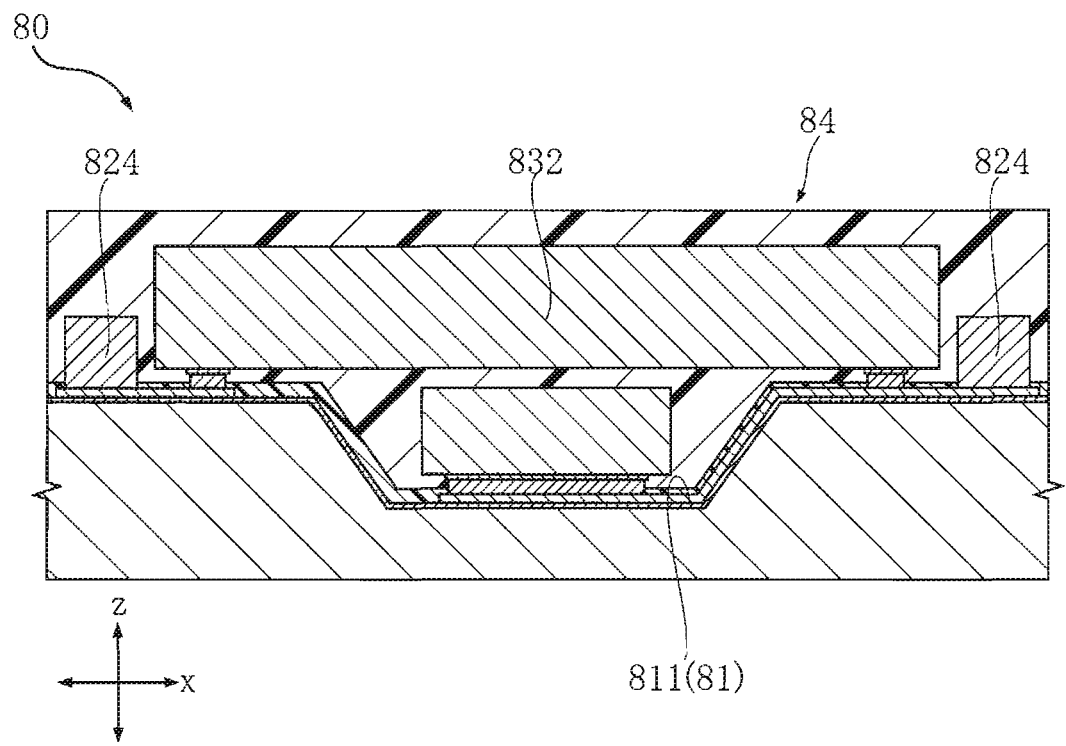
FIG. 19 is a cross-sectional view showing the step of fabricating the semiconductor device shown in FIG. 1.

Then, as shown in FIG. 19, a sealing resin 84 is formed to be filled into the recess 81, and to cover the columnar member 824 and the second element 832. The sealing resin 84 of the present embodiment is a black epoxy resin. The sealing resin 84 is formed by compression molding.

Figure 20:
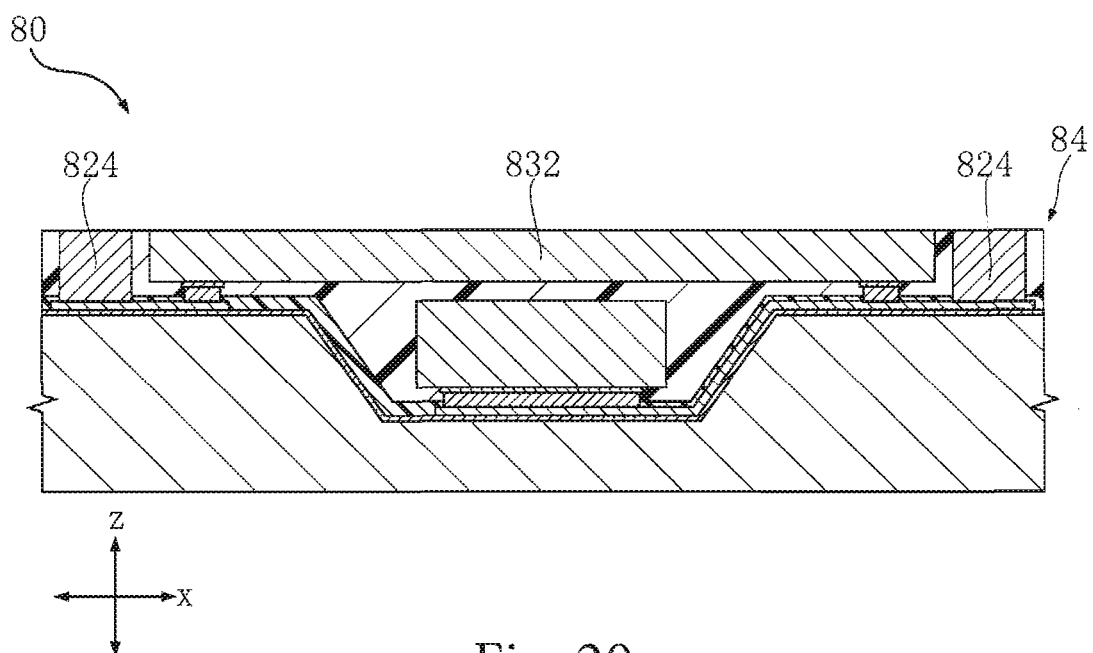
FIG. 20 is a cross-sectional view showing the step of fabricating the semiconductor device shown in FIG. 1.

Then, as shown in FIG. 20, an end of each of the columnar member 824, the second element 832 and the sealing resin 84 in the thickness direction z is removed. The removal is performed by mechanical grinding. Further, the removed range in the thickness direction z is corresponding to the portion of the second element 832 where no circuit is formed. In the case that the removal is completed, the columnar member 824 is corresponding to the columnar conductor 22 of the semiconductor device A10, the second element 832 is corresponding to the semiconductor element 31 of the semiconductor device A10, and the sealing resin 84 is corresponding to the sealing resin 4 of the semiconductor device A10.

Figure 21:
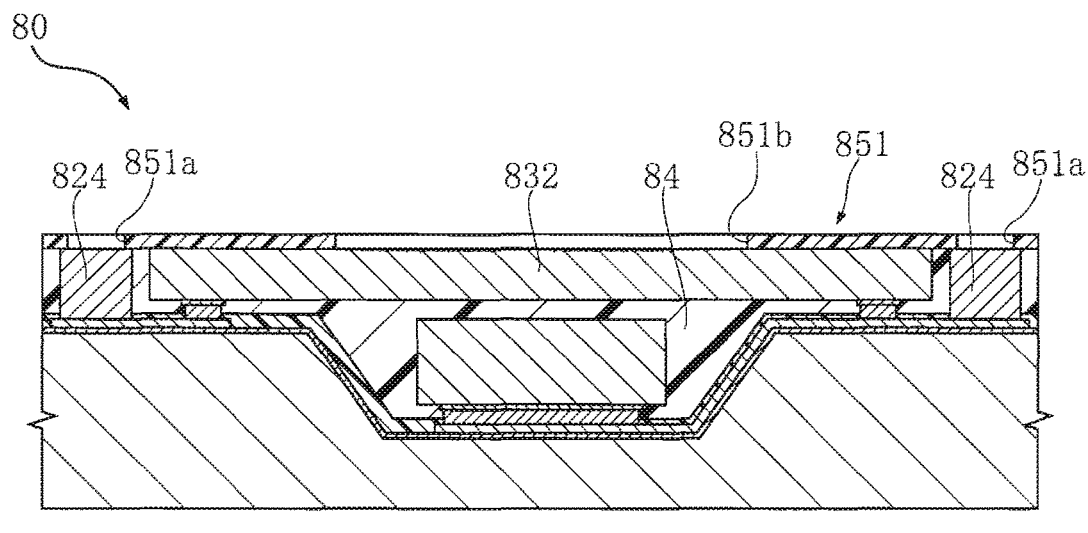
FIG. 21 is a cross-sectional view showing the step of fabricating the semiconductor device shown in FIG. 1.

Then, as shown in FIG. 21, a third insulating film 851 is formed to be in contact with an end of each of the columnar member 824, the second element 832 and the sealing resin 84 in the thickness direction z. The third insulating film 851 is corresponding to the first insulating film 511 of the external insulating film 51 of the semiconductor device A10. For example, the photosensitive polyimide is coated on an end of those by using a spin coater, and then exposure and development of photolithography are performed so as to form the third insulating film 851. At this time, by the exposure and the development, a first opening 851a penetrating to an end surface of the columnar member 824 and a second opening 851b penetrating to an end surface of the second element 832 are formed on the third insulating film 851.

Figure 22:
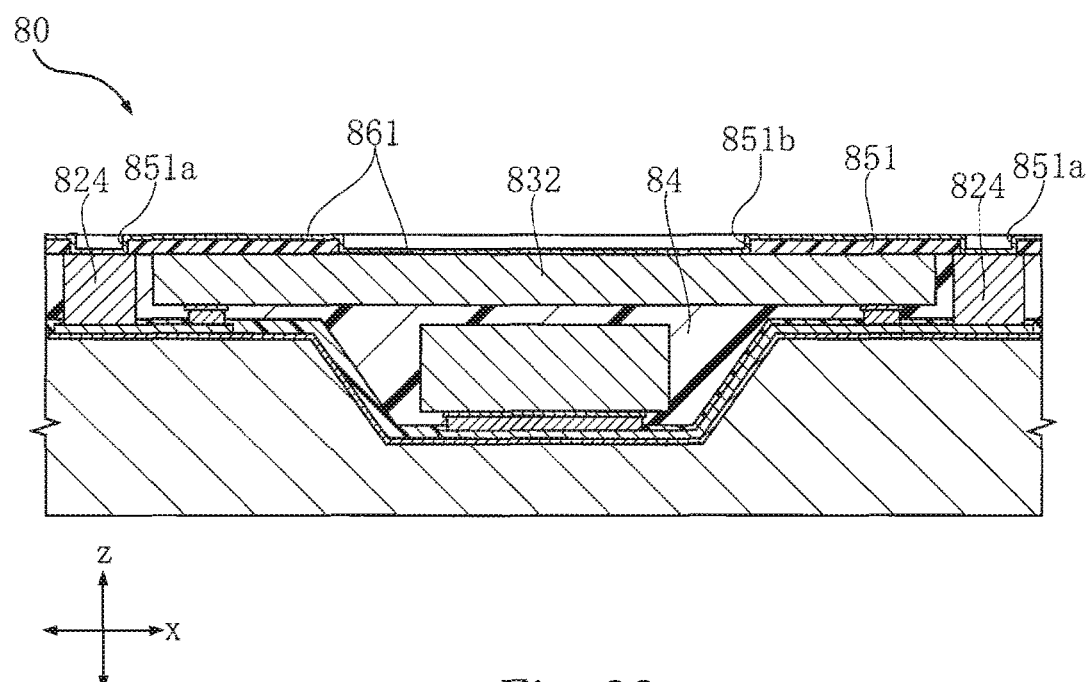
FIG. 22 is a cross-sectional view showing the step of fabricating he semiconductor device shown in FIG. 1.

Then, as shown in FIG. 22, a second base layer 861 is formed to be in contact with the third insulating film 851. The material of the second base layer 861 is the same as that of the first base layer 821, and the second base layer 861 is formed by sputtering. At this time, the columnar member 824 exposed form the first opening 851a and the second element 832 exposed from the second opening 851b are both covered by the second base layer 861.

Figure 23:
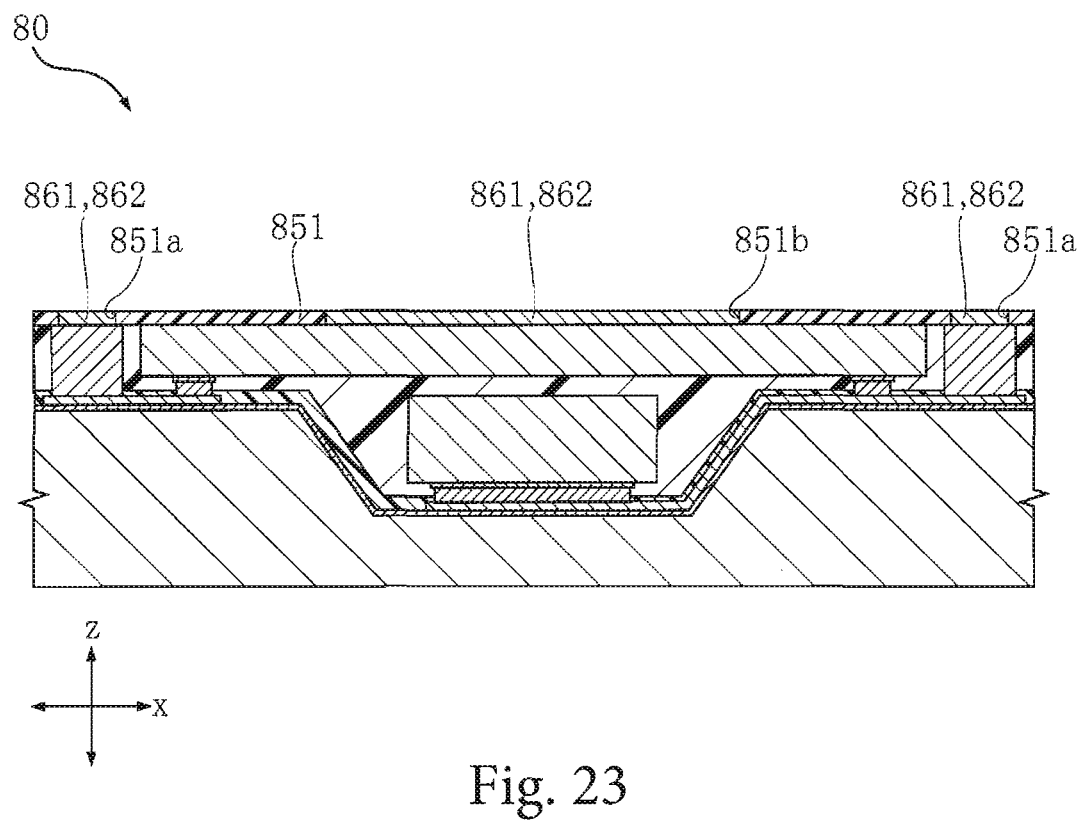
FIG. 23 is a cross-sectional view showing the step of fabricating the semiconductor device shown in FIG. 1.

Then, as shown in FIG. 23, a second plating layer 862 is formed to be in contact with the second base layer 861 and filled into the first opening 851a and the second opening 851b. The material of the second plating layer 862 is the same as that of the first plating layer 822. After the patterns are formed by photolithography, electrolytic plating is performed by using the second base layer 861 so as to form the second plating layer 862. After the second plating layer 862 is formed, the patterned resist layer (not shown) and the second base layer 861 which is formed outside the first opening 851a and the second opening 851b is removed. The method for removing the second base layer 861 is the same as the step for removing the first base layer 821 shown in FIG. 17. In the case that the removal of the second base layer 861 is completed, the second base layer 861 filled in the first opening 851a and the second plating layer 862 are corresponding to the first embedded portion 521 of the external wiring layer 52 of the semiconductor device A10. Also, the second base layer 861 filled in the second opening 851b and the second plating layer 862 are corresponding to the first layer 591 of the heat dissipating layer 59 of the semiconductor device A10.

Figure 24:
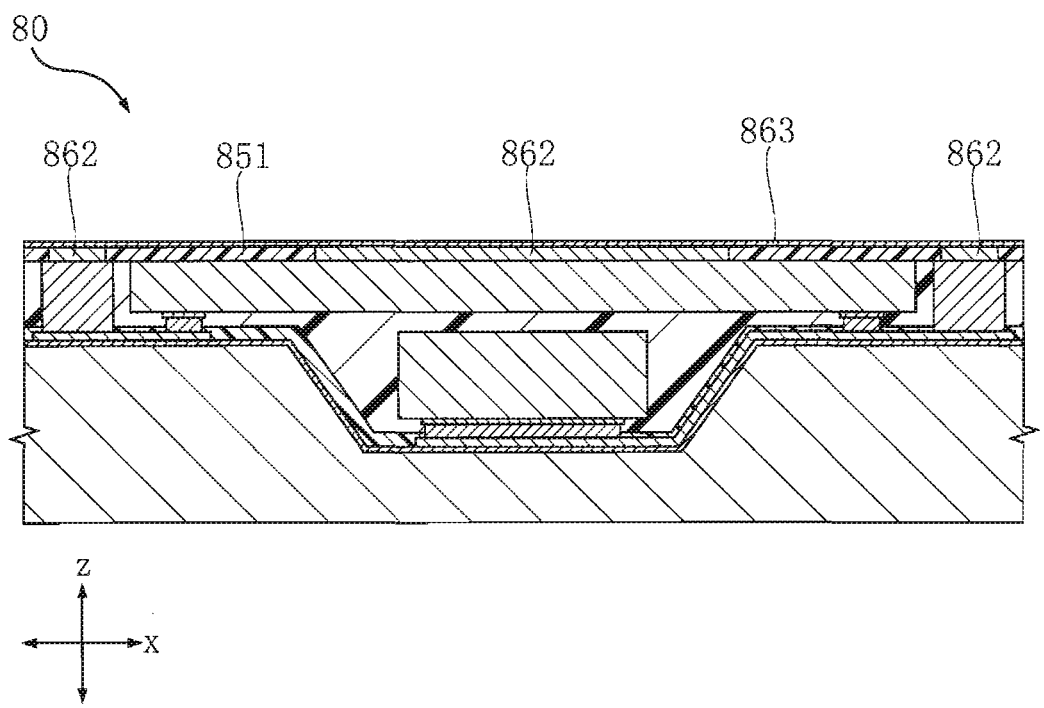
FIG. 24 is a cross-sectional view showing the step of fabricating the semiconductor device shown in FIG. 1.

Then, as shown in FIG. 24, a third base layer 863 is formed to be in contact with the third insulating film 851 and the second plating layer 862. The material of the third base layer 863 is the same as that of the first base layer 821, and the third base layer 863 is formed by sputtering.

Figure 25:
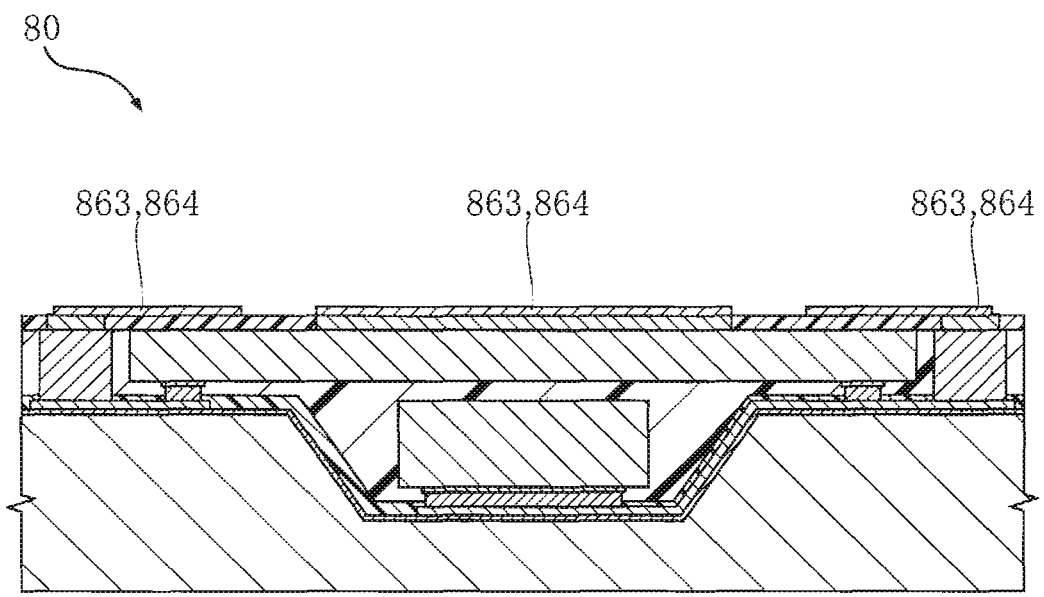
FIG. 25 is a cross-sectional w showing the step of fabricating the semiconductor device shown in FIG. 1.

Then, as shown in FIG. 25, a third plating layer 864 is formed to be in contact with the third base layer 863. The material of the third plating layer 864 is the same as that of the first plating layer 822. After the patterns are formed by photolithography, electrolytic plating is performed by using the third base layer 863 so as to form the third plating layer 864. The third plating layer 864 is formed on the third base layer 863 exposed from the patterned resist layer (not shown). After the third plating layer 864 is formed, the resist layer and the third base layer 863 which is not covered by the third plating layer 864 are removed. The method for removing the third base layer 863 is the same as the step for removing the first base layer 821 shown in FIG. 17. In the case that the removal of the third base layer 863 is completed, the third base layer 863 and the third plating layer 864 which are laminated with each other are corresponding to the intermediate portion 523 of the external wiring layer 52 and the second heat dissipating layer of the heat dissipating layer 59 of the semiconductor device A10.

Figure 26:
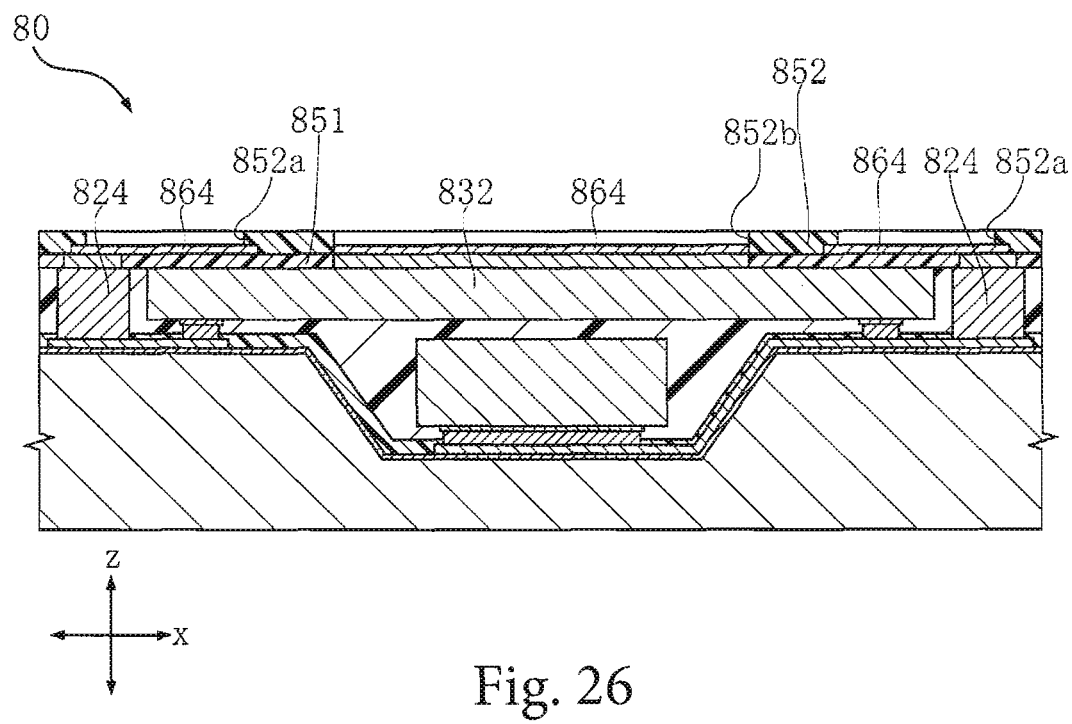
FIG. 26 is a cross-sectional view showing the step of fabricating the semiconductor device shown in FIG. 1.

Then, as shown in FIG. 26, a fourth insulating film 852 is formed to be in contact with the third insulating film 851. The fourth insulating film 852 is corresponding to the second insulating film 512 of the external insulating film 51 of the semiconductor device A10. The material of the fourth insulating film 852 is the same as that of the third insulating film 851, and the fourth insulating film 852 is formed by the same method as the step for forming the third insulating film 851 shown in FIG. 20. By the exposure and the development of the photolithography, a third opening 852a penetrating to the third plating layer 864 formed on the end surface of the columnar member 824 is formed on the fourth insulating film 852. Also, a fourth opening 852b penetrating to the third plating layer 864 formed on the end surface of the second element 832 is formed on the fourth insulating film 852.

Figure 27:
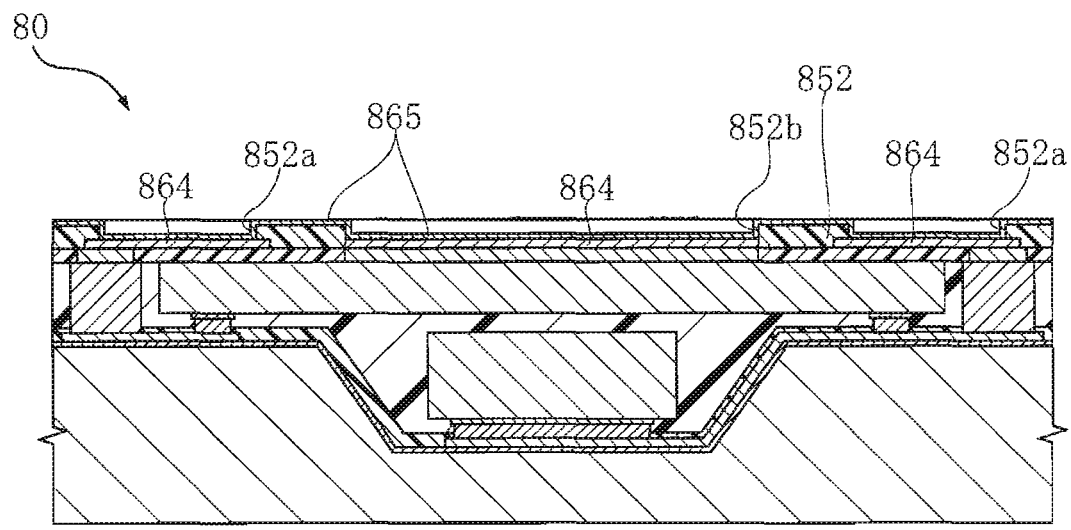
FIG. 27 is a cross-sectional view showing the step of fabricating the semiconductor device shown in FIG. 1.

Then, as shown in FIG. 27, a fourth base layer 865 is formed to be in contact with the fourth insulating film 852. The material of the fourth base layer 865 is the same as that of the first base layer 821, and the fourth base layer 865 is formed by sputtering. At this time, the third plating layer 864 exposed form the third opening 852a and the third plating 864 exposed from the fourth opening 852b are both covered by the fourth base layer 865.

Figure 28:
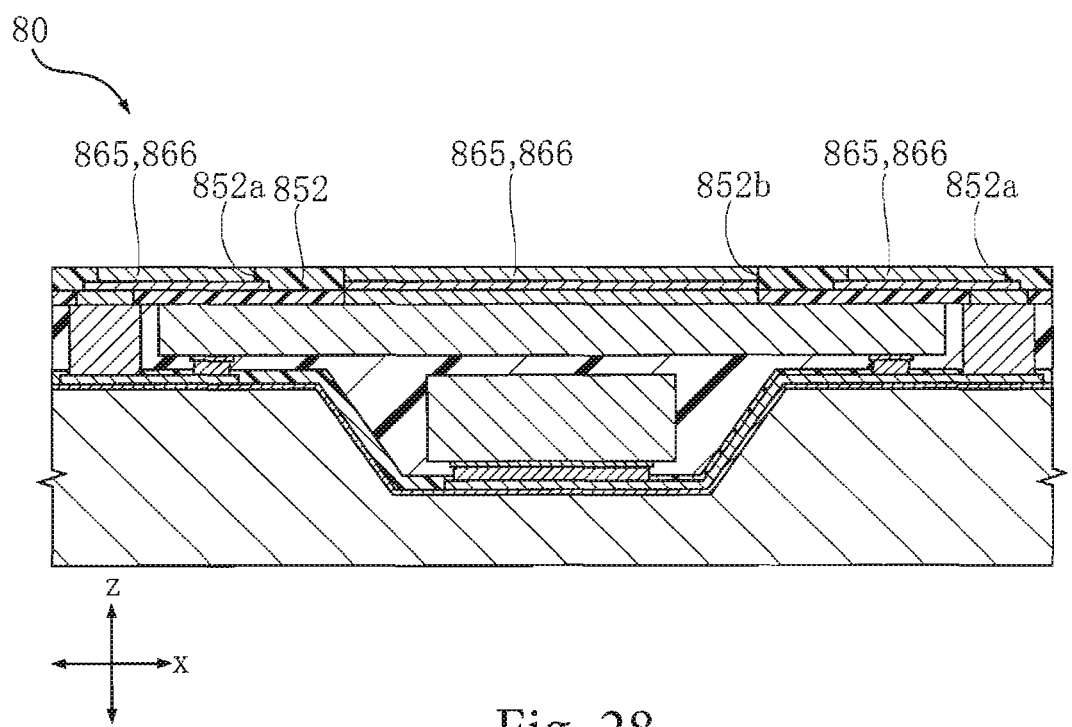
FIG. 28 is a cross-sectional view showing the step of fabricating the semiconductor device shown in FIG. 1.

Then, as shown in FIG. 28, a fourth plating layer 866 is formed to be in contact with the fourth base layer 865 and filled into the third opening 852a and the fourth opening 852b. The material of the fourth plating layer 866 is the same as that of the first plating layer 822. After the patterns are formed by photolithography, electrical plating is performed by using the fourth base layer 865 so as to form the fourth plating layer 866. After the fourth plating layer 866 is formed, the patterned resist layer (not shown) and the fourth base layer 865 which is formed outside the third opening 852a and the fourth opening 852b are removed. The method for removing the fourth base layer 865 is the same as the step for removing the first base layer 821 shown in FIG. 17. In the case that the removal of the fourth base layer 865 is completed, the fourth base layer 865 filled into the third opening 852a and the fourth plating layer 866 are corresponding to the second embedded portion 522 of the external wiring layer 52 of the semiconductor device A10. Also, the fourth base layer 865 filled into the fourth opening 852b and the fourth plating layer 866 are corresponding to the third layer 593 of the heat dissipating layer 59 of the semiconductor device A10.

Figure 29:
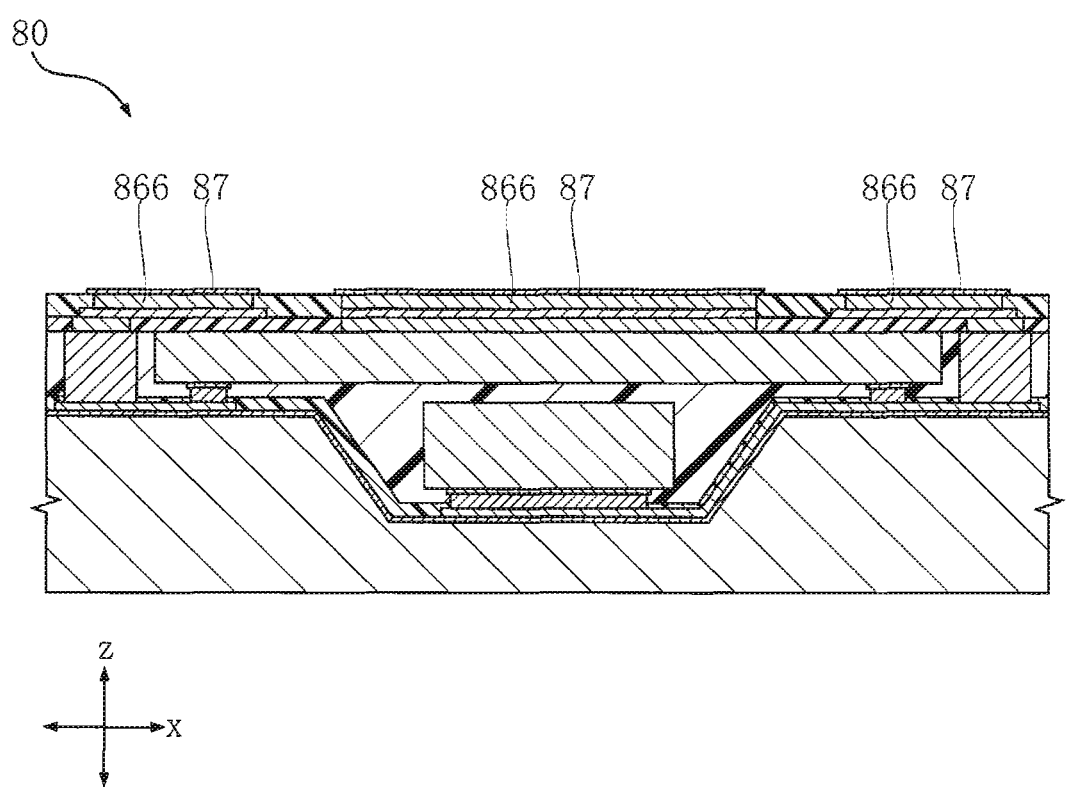
FIG. 29 is a cross-sectional view showing the step of fabricating the semiconductor device shown in FIG. 1.

Then, as shown in FIG. 29, a metal thin film 87 is formed to be in contact with the fourth plating layer 866. The metal thin film 87 comprises a Ni layer, a Pd layer and an Au layer laminated with each other. The metal thin film 87 is formed by deposition of each metal layer by electroless plating according to the sequence of the Ni layer, the Pd layer and the Au layer. In the case that the formation of the metal thin film 87 is completed, the metal thin film 87 which is in contact with the fourth plating layer 866 filled into the third opening 852a is corresponding to the terminal 6 of the semiconductor device A10. Also, the metal thin film 87 which is in contact with the fourth plating layer 866 filled in the fourth opening 852b is corresponding to the fourth layer 594 of the heat dissipating layer 59 of the semiconductor device A10. Further, while forming the metal thin film 87, the heat dissipating layer 59 disposed on the fourth layer 594 can be omitted by masking the fourth plating layer 866 filled into the fourth opening 852b.

Figure 30:
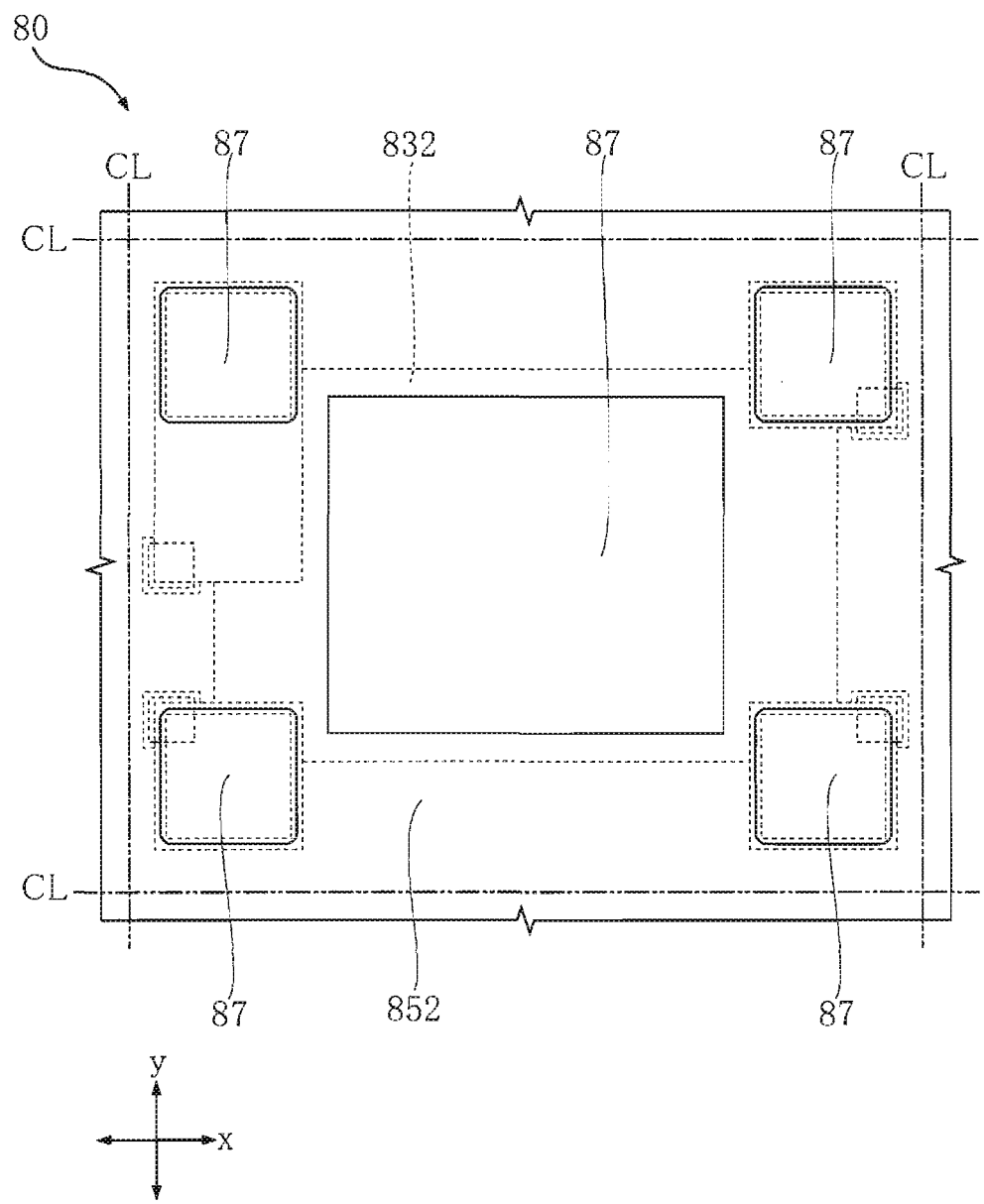
FIG. 30 is a cross-sectional view showing the step of fabricating the semiconductor device shown in FIG. 1.

Finally, as shown in FIG. 30, the substrate 80, the sealing resin 82 and the like are cut along the cutting line CL, such that the substrate 80 mounted with various constituting component is cut into a single slice of the semiconductor device A10. For the cutting, for example, plasma cutting is applied. Upon cutting, each single slice becomes the semiconductor device A10. By the above steps, the semiconductor device A10 is fabricated.

Then, the effects of the semiconductor device A10 are illustrated.

The semiconductor device A10 includes the recess 13 accommodated in the substrate 1, and the sealing resin 4 covering a portion of each of the columnar conductor 22 and the semiconductor element 31, respectively. Further, in the semiconductor device A10, the semiconductor element 31 has a portion overlapping the recess in the top view, and the heat dissipating layer 59 is configured to be in contact with the element main surface 311 of the semiconductor element 31 and exposed to the outside. By this configuration, when the semiconductor device A10 is electrically connected, the heat generated from the semiconductor element 31 is high efficiently dissipated to the outside via the heat dissipating layer 59. Therefore, according to the semiconductor device A10, the heat generated from the semiconductor element 31 can be high efficiently dissipated to the outside.

The semiconductor device A10 includes the internal insulating film covering the substrate main surface 11 and the recess 13. By this configuration, the dissipation of heat generated from the semiconductor element 31 can be further improved. Further, the material of the internal insulating film 19 is preferably AlN.

In the semiconductor device A10, the semiconductor element 31 is mounted on the first wiring layer 211 in a state of crossing the recess 13 in the top view. By this configuration, the passive element 32 can be accommodated in the recess 13, such that the width formed by the circuit in the semiconductor device A10 can be expanded.

In the semiconductor device A10, the first bonding layer 27 is disposed on the first wiring layer 211, protrudes from the first wiring layer 211 toward the direction in which the substrate main surface 11 faces, and is disposed away from the columnar conductor 22. The semiconductor element 31 is bonded to the first bonding layer 27. By this configuration, the semiconductor element 31 is mounted on the first wiring layer 211 by flip-chip mounting, such that the minimization of the semiconductor device A10 can be achieved.

The semiconductor device A10 includes the protecting film 29 covering the first wiring layer 211 and the second wiring layer 212. Each of the columnar conductor 22 and the first bonding layer 27 has a portion protruding from the protecting film 29. By this configuration, when the semiconductor element 31 is mounted on the first wiring layer 211 by flip-chip mounting, even in the case that the melted first bonding layer 27 is overflowed from the first wiring layer 211, no unexpected conductive path would be formed on the internal wiring layer 21.

The semiconductor device A10 includes the external insulating film 51 covering a portion of the element main surface 311 and the resin main surface 41 and exposed to the outside. By this configuration, the external wiring layer 52 which connects the columnar conductor 22 to the terminal 6 can be disposed inside the external insulating film 51. Therefore, the arrangement pattern in which the external wiring layer 52 overlaps the semiconductor element 31 in the top view can be adapted. Hence, the enlargement of the semiconductor device A10 can be avoided, and the wiring pattern of the external wiring layer 52 can be freely designed.

Further, by using the external insulating film 51, the arrangement in which the terminal 6 and the external wiring layer 52 together overlap the semiconductor element 31 in the top view can be adapted. Therefore, the area of the terminal 6 can be significantly expanded in the top view, and the heat dissipation of the semiconductor device A10 is further improved.

The top surface 221 of the columnar conductor 22 and the resin main surface 41 are both the same as the element main surface 311. By this configuration, the size of the semiconductor device A10 in the thickness direction z can be set as shorter, so as to reduce the thickness of the device. Further, by photolithography and electrolytic plating, the external wiring layer 52 and the heat dissipating layer 59 can be formed at the same time.

[Second Embodiment]

Based on FIG. 31-FIG. 34, a semiconductor device A20 of the second embodiment of the present disclosure is illustrated. In these figures, the components the same as or similar to those of the above semiconductor device A10 are labeled as identical reference numerals, and the repeated descriptions are omitted.

Figure 31:
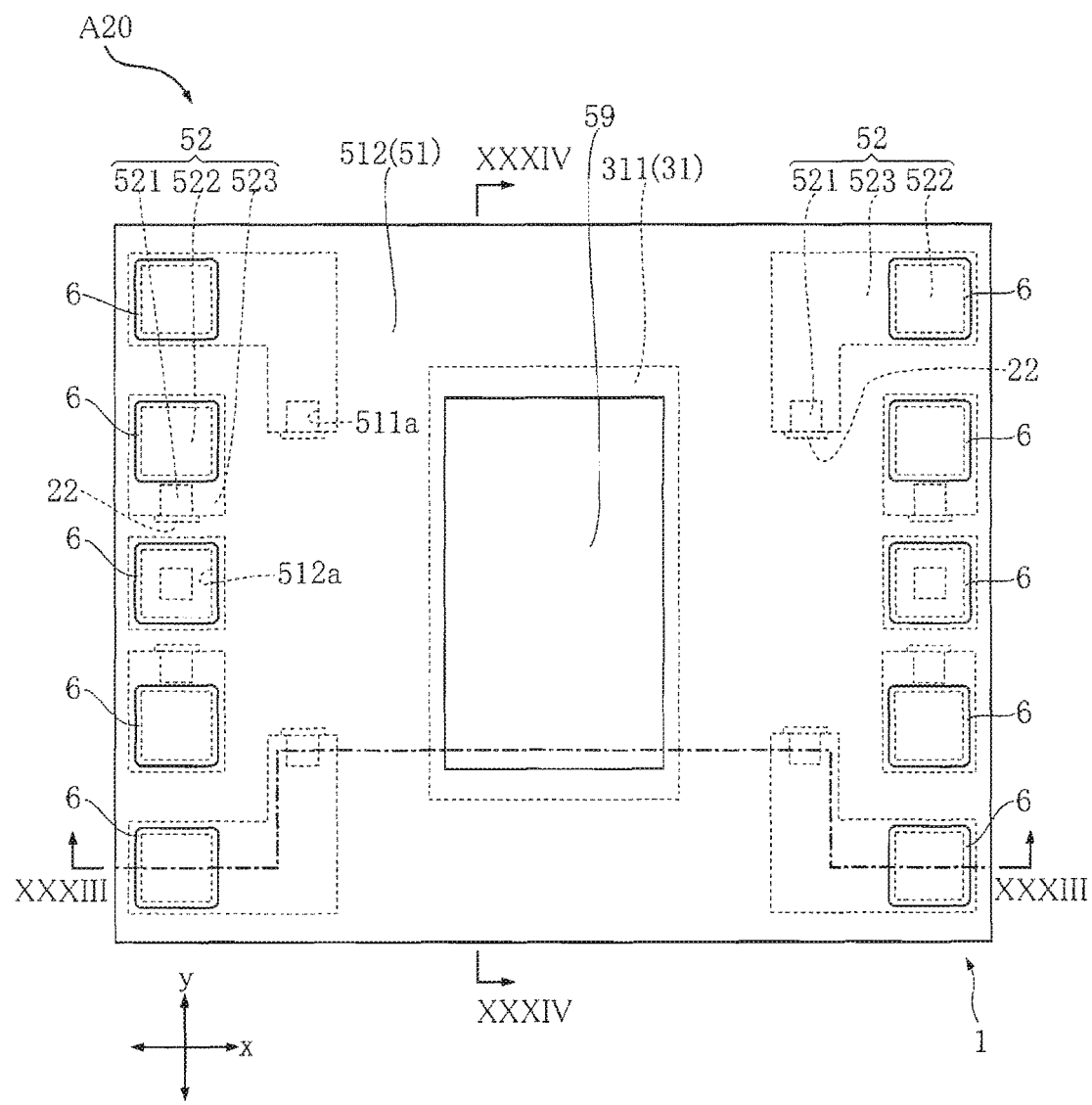
FIG. 31 is a top view showing a semiconductor device according to the second embodiment of the present disclosure.
Figure 32:
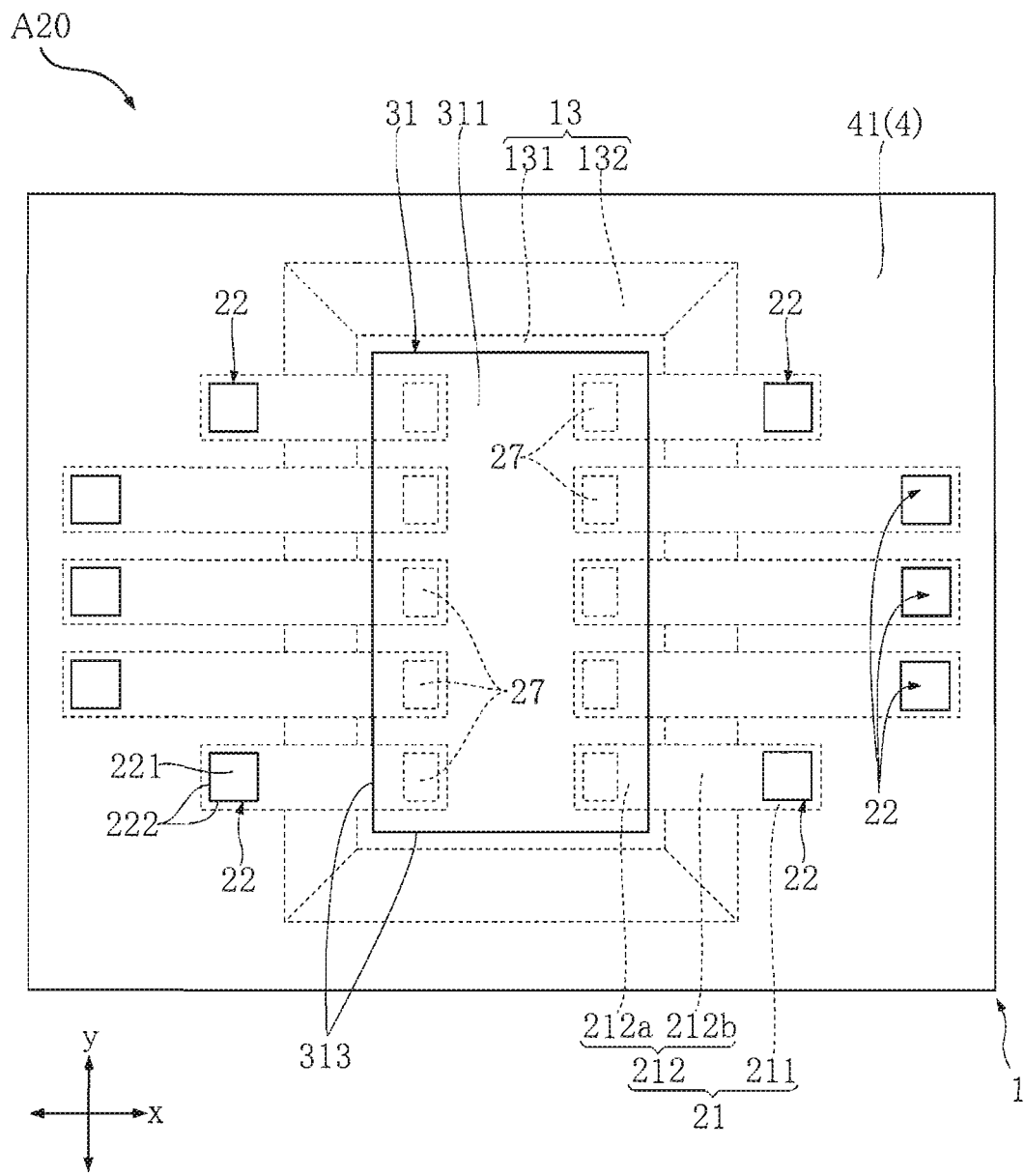
FIG. 32 is a top view of the semiconductor device shown in FIG. 31 (omitting the sealing resin, the external insulating film, the external wiring layer, the heat dissipating layer, and the terminal).

For the ease of understanding, the sealing resin 4, the external insulating film 51, the external wiring layer 52, the heat dissipating layer 59 and the terminal 6 are omitted in FIG. 32. Further, FIG. 32 is a cross-sectional view taken along the single dot chain line shown in FIG. 31.

In the semiconductor device A20 of the present embodiment, the configuration of the semiconductor element 31 mounted on the internal wiring layer 21 is different from that of the above semiconductor device A10.

As shown in FIG. 31-FIG. 34, the semiconductor element 31 is mounted on the bottom surface 212a of the second wiring layer 212 disposed on. the recess 13. In this case, a portion of the semiconductor element 31 is accommodated in the recess 13, and the element main surface 311 is disposed away from the recess 13 with respect to the substrate main surface 11 in the thickness direction z. Further, in the present embodiment, the top surface 221 of the columnar conductor 22 and the resin main surface 41 are both the same as the element main surface 311.

Figure 33:
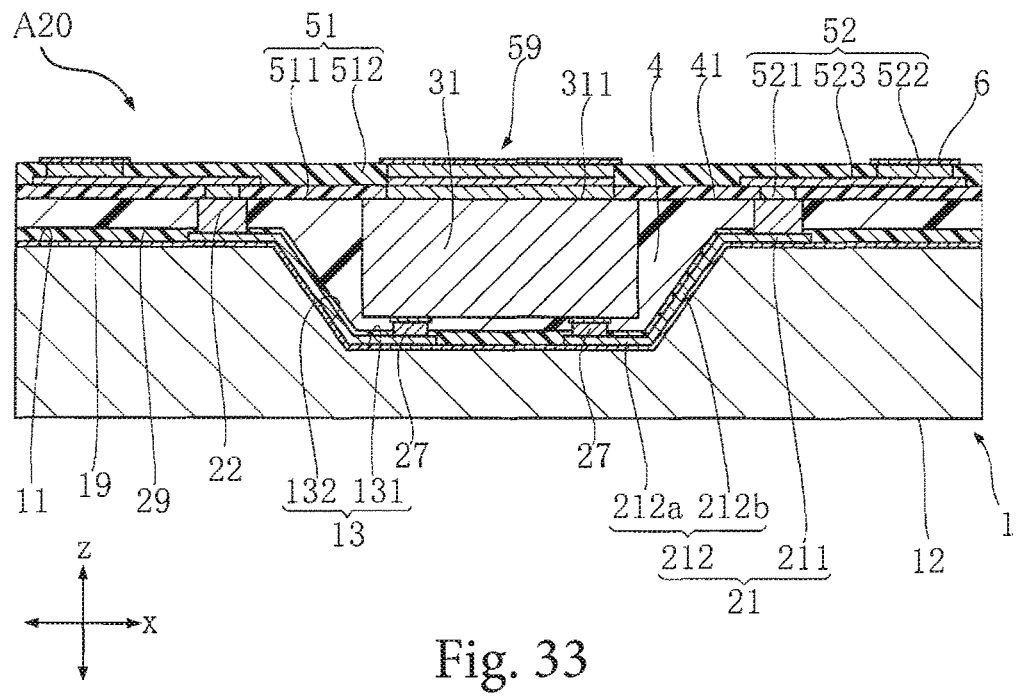
FIG. 33 is a cross-sectional view taken along line XXXIII-XXXIII in FIG. 33.
Figure 34:
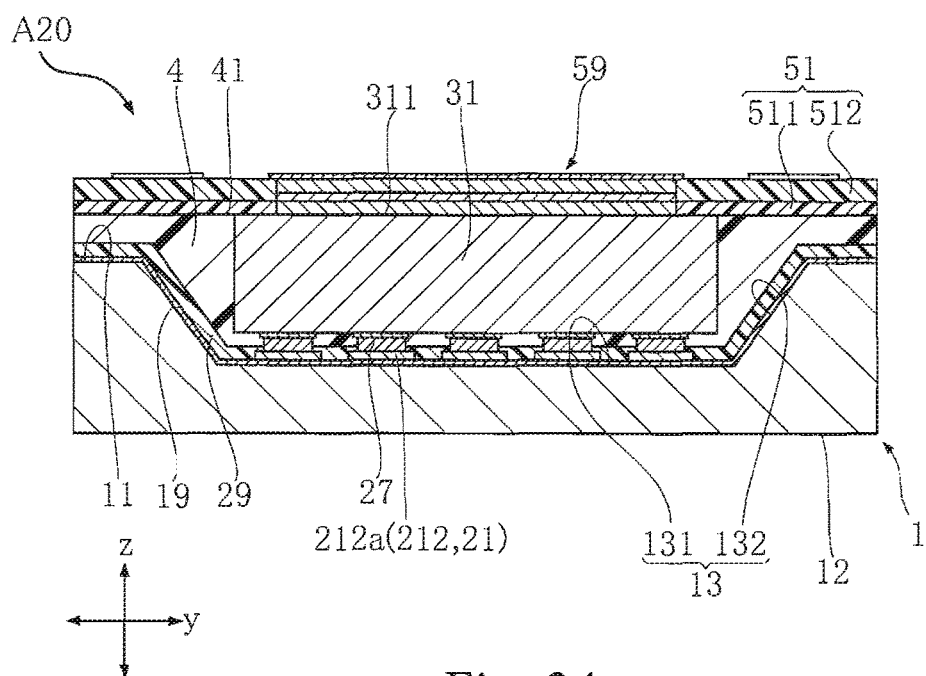
FIG. 34 is a cross-sectional view taken along line XXXIV-XXXIV in FIG. 31.

As shown in FIG. 32-FIG. 34, the first bonding layer 27 is disposed on the bottom surface portion 212a of the second wiring layer 212. The first bonding layer 27 protrudes from the second wiring layer 212 toward the inner side of the recess 13. The internal wiring layer 21, the columnar conductor 22 and the first bonding layer 27 are arranged to be corresponding to the electrode bumps 31a of the semiconductor element 31, and are all disposed in ten places. Further, as shown in FIG. 31, the arrangement of the external wiring layers 52 and the terminals 6 are designed to be corresponding to the arrangement of the columnar conductors 22.

In the present embodiment, the configuration in which the passive element 32 is not mounted on the internal wiring layer 21 is formed. Therefore, the second bonding layer 28 for bonding the passive element 32 with the internal wiring layer 21 is omitted.

Further, the method for fabricating the semiconductor device A20 is the same as the example of the method for fabricating the above semiconductor device A10.

Then, the effects of the semiconductor device A20 are illustrated.

Similarly to the above semiconductor device A10, the semiconductor device A20 includes the recess 13 accommodated in the substrate 1, and the sealing resin 4 covering a portion of each of the columnar conductor 22 and the semiconductor element 31. Further, in the semiconductor device A20, the semiconductor element 31 has a portion overlapping the recess 13 in the top view, and the heat dissipating layer 59 is configured to be in contact with the element main surface 311 of the semiconductor element 31 and exposed to the outside. Therefore, by the semiconductor device A20, the heat generated from the semiconductor element 31 can be high efficiently released to the outside.

In the semiconductor device A20, the first bonding layer 27 is disposed on the second wiring layer 212 and protrudes from the second wiring layer 212 toward the inner side of the recess 13. The semiconductor element 31 is bonded to the first bonding layer 27. By this configuration, the semiconductor element 31 is mounted on the second wiring layer 212 by flip-chip mounting, such that the minimization of the semiconductor device A20 can be achieved.

The present disclosure is not limited to the above embodiments. Various designs and changes can be freely made to the configuration of each part of the present disclosure.

What is claimed is:

1. A semiconductor device, comprising:
    a substrate, made of an intrinsic semiconductor material, having a substrate main surface facing toward a thickness direction, and configured to have a recess recessed from the substrate main surface;
    an internal wiring layer, disposed on the substrate main surface and the recess;
    a columnar conductor, protruding from the internal wiring layer disposed on the substrate mam surface toward a direction in which the substrate main surface faces;
    a semiconductor element, having an element mam surface facing the same direction as the substrate main surface, and electrically connected to the internal wiring layer; and
    a sealing resin, filled into the recess and covering a portion of each of the columnar conductor and the semiconductor element;
    wherein the semiconductor element has a portion overlapping the recess when viewed in the thickness direction of the substrate, and
    the semiconductor device is configured to have a heat dissipating layer being in contact with the element main surface and exposed to the outside,
    the columnar conductor has a top surface facing the same direction as the substrate main surface,
    the sealing resin has a resin main surface facing the same direction as the substrate main surface, and
    the top surface and the resin main surface are the same as the element main surface.

2. The semiconductor device of claim 1, further comprising an external insulating film configured to cover a portion of the element mam surface and the resin main surface and be exposed to the outside, and
    the heat dissipating layer is exposed from the external insulating film.

3. The semiconductor device of claim 2, further comprising a terminal electrically connected to the columnar conductor and connected to the outside, and
    the terminal is exposed from the external insulating film.

4. The semiconductor device of claim 3, wherein the external insulating film has a first insulating film being in contact with a portion of the element main surface and the resin main surface, and a second insulating film being in contact with the first insulting film and exposed to the outside, and
    the semiconductor device further comprises an external wiring layer disposed inside the first insulating film and the second insulating film and connecting the columnar conductor to the terminal.

5. The semiconductor device of claim 4, wherein a first opening portion penetrating the first insulating film along the thickness direction to the top surface of the columnar conductor is formed on first insulating film,
    a second opening portion penetrating the second insulating film along the thickness direction is formed on the second insulating film, and
    the external wiring layer has a first embedded portion being embedded in the first opening portion and in contact with the top surface, and a second embedded portion being embedded m the second opening portion and in contact with the terminal.

6. The semiconductor device of claim 5, wherein the external wiring layer further comprises an intermediate portion, and the intermediate portion is between the first insulating film and the second insulating film, and connected to both the first embedded portion and the second embedded portion.

* * * * *